United States Patent
Wu et al.

(10) Patent No.: US 9,305,837 B2
(45) Date of Patent: Apr. 5, 2016

(54) SEMICONDUCTOR ARRANGEMENT AND FORMATION THEREOF

(71) Applicant: Taiway Semiconductor Manufacturing Company Limited, Hsin-Chu (TW)

(72) Inventors: Chia-Tien Wu, Taichung (TW); Tien-Lu Lin, Hsinchu (TW); Shau-Lin Shue, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/249,407

(22) Filed: Apr. 10, 2014

(65) Prior Publication Data
US 2015/0294905 A1 Oct. 15, 2015

(51) Int. Cl.
*H01L 21/311* (2006.01)
*H01L 21/768* (2006.01)
*H01L 23/528* (2006.01)
*H01L 23/532* (2006.01)

(52) U.S. Cl.
CPC ...... *H01L 21/76831* (2013.01); *H01L 21/7684* (2013.01); *H01L 21/76816* (2013.01); *H01L 21/76879* (2013.01); *H01L 23/528* (2013.01); *H01L 23/53228* (2013.01)

(58) Field of Classification Search
CPC . H01L 21/762; H01L 21/308; H01L 21/0228; H01L 21/3212; H01L 21/76831; H01L 21/0465; H01L 21/467; H01L 21/475; H01L 21/28079; H01L 21/2822; H01L 21/2819
USPC ......... 438/700, 637, 270, 692, 725, 733, 738, 438/743, 744, 753, 758, 769; 257/396, 310, 257/E21.006, E21.027, E21.029, E21.058, 257/E21.077, E21.126, E21.127, E21.231, 257/E21.249, E21.267, E21.304, E21.332, 257/E21.769
See application file for complete search history.

(56) References Cited

U.S. PATENT DOCUMENTS

| 8,026,179 | B2 | 9/2011 | Lue |
| 8,206,179 | B2 * | 6/2012 | Ouellette et al. ............... 439/638 |
| 8,932,955 | B1 * | 1/2015 | Sel et al. ........................ 438/694 |
| 8,969,206 | B1 * | 3/2015 | Sel et al. ........................ 438/696 |

(Continued)

FOREIGN PATENT DOCUMENTS

EP 2287667 B1 3/2013

OTHER PUBLICATIONS

Corresponding Taiwan application 104100363, Taiwan Office action dated Jan. 19, 2016.

*Primary Examiner* — David Nhu
(74) *Attorney, Agent, or Firm* — Cooper Legal Group, LLC

(57) ABSTRACT

A semiconductor arrangement and method of formation are provided. The semiconductor arrangement includes a first metal trace having a first metal trace width between about 30 nm to about 60 nm and a first metal trace length. A second metal trace has a second metal trace width between about 10 nm to about 20 nm and a second metal trace length, the first metal trace length different than the second metal trace length. A dielectric layer is between the first metal trace and the second metal trace. The dielectric layer has a dielectric layer width between the first metal trace and the second metal trace between about 10 nm to about 20 nm. The semiconductor arrangement is formed in a manner that allows metal traces having small dimensions to be formed where the metal traces have different dimensions from one another.

19 Claims, 17 Drawing Sheets

(56) References Cited

U.S. PATENT DOCUMENTS

| | | | |
|---|---|---|---|
| 9,034,762 B2 * | 5/2015 | Hong | 438/696 |
| 2007/0077524 A1 * | 4/2007 | Koh et al. | 430/314 |
| 2008/0090418 A1 * | 4/2008 | Jeon et al. | 438/689 |
| 2012/0085733 A1 | 4/2012 | Mebarki et al. | |

* cited by examiner

SEMICONDUCTOR ARRANGEMENT AND FORMATION THEREOF

BACKGROUND

In semiconductor arrangements various layers of conductive material are separated from one another by dielectric or non-conductive layers. Electrically conductive vias are formed within or through the dielectric layers to selectively connect different conductive layers to one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
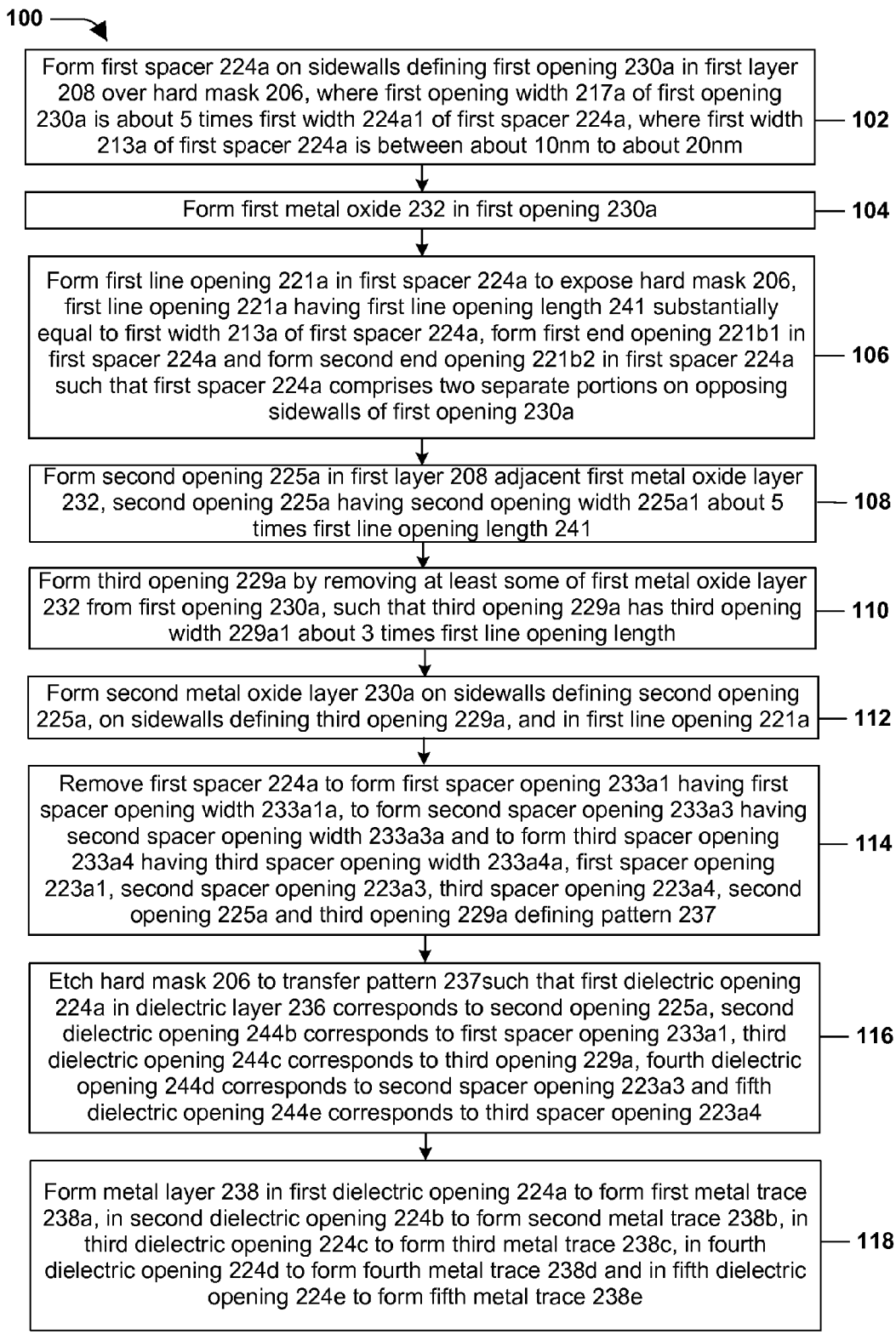
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 32:
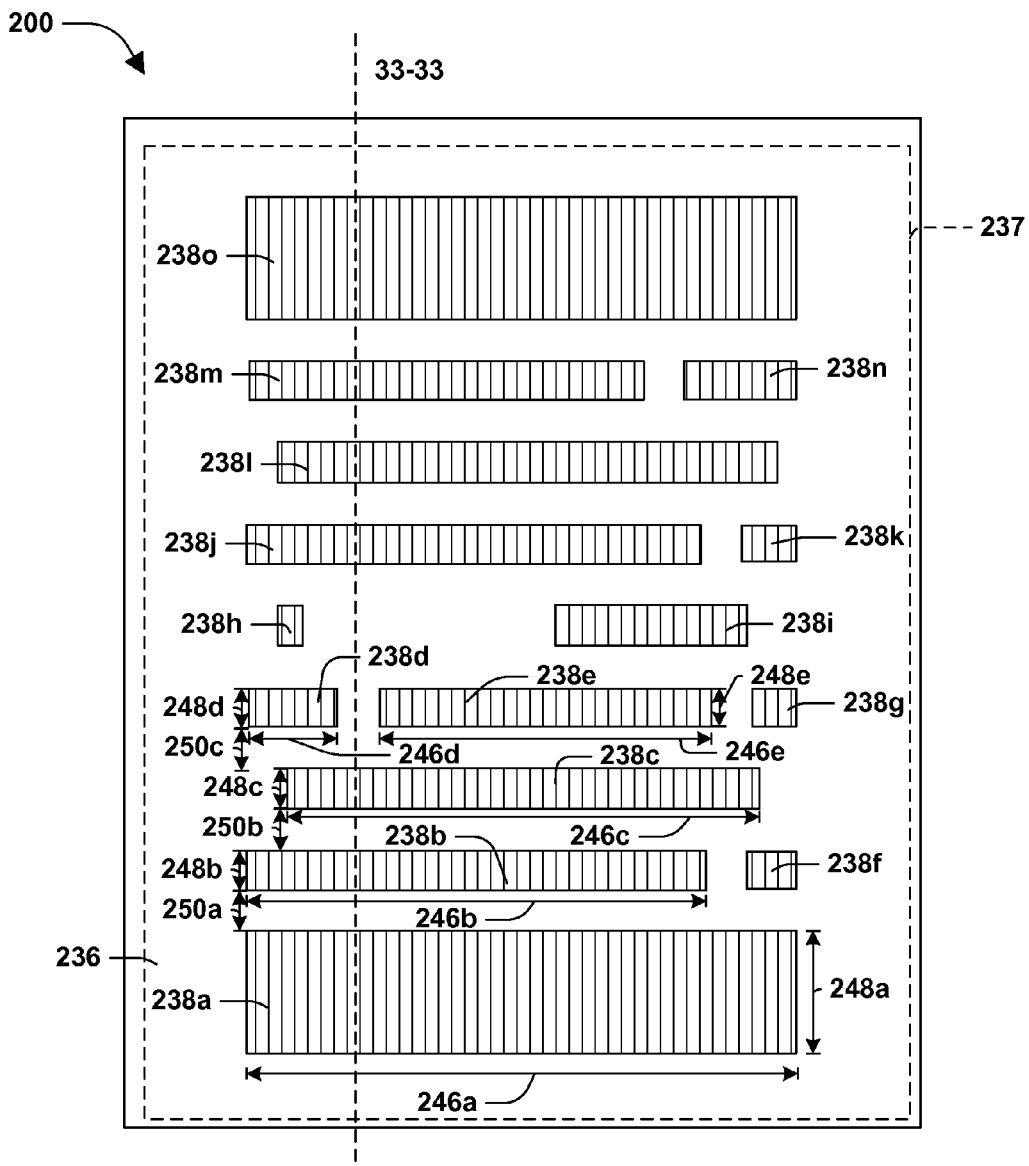
FIG. 32 is an illustration of a semiconductor arrangement, in accordance with some embodiments.
Figure 33:
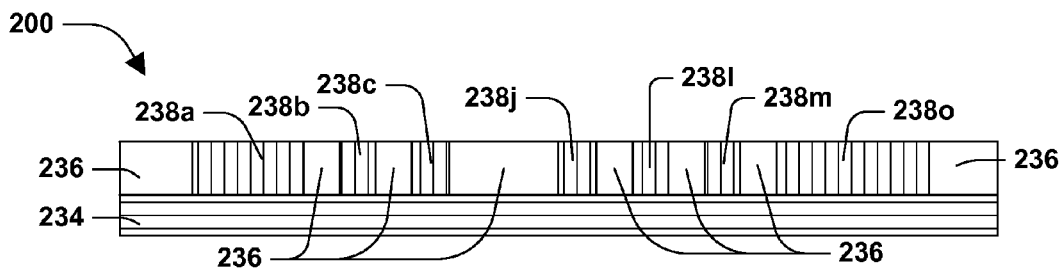
FIG. 33 is an illustration of a semiconductor arrangement, in accordance with some embodiments.

A method 100 of forming a semiconductor arrangement 200 is illustrated in FIG. 1, and one or more semiconductor arrangements formed by such methodology are illustrated in FIGS. 2-33. In some embodiments, such as illustrated in FIGS. 32 and 33, where FIG. 32 illustrates a top down or overview of the semiconductor arrangement 200, and FIG. 33 illustrates a cross section of FIG. 32 along a line 33-33, the semiconductor arrangement 200 comprises a first metal trace 238a having a first metal trace width 248a between about 30 nm to about 60 nm and a first metal trace length 246a. In some embodiments, a second metal trace 238b has a second metal trace width 248b between about 10 nm to about 20 nm and a second metal trace length 246b. In some embodiments, the first metal trace length 246a is different than the second metal trace length 246b. In some embodiments, a dielectric layer 236 is between the first metal trace 238a and the second metal trace 238b. In some embodiments, the dielectric layer 236 has a dielectric layer width 250a between the first metal trace 238a and the second metal trace 238b between about 10 nm to about 20 nm. In some embodiments, a third metal trace 238c has a third metal trace width 248c between about 10 nm to about 20 nm and a third metal trace length 246c, such that the dielectric layer 236 has a second dielectric layer width 250b between the second metal trace 238b and the third metal trace 238c between about 10 nm to about 20 nm. In some embodiments, the third metal trace length 246c is at least one of greater then, equal to or less than the first metal trace length 246a. In some embodiments, a fourth metal trace 238d has a fourth metal trace width 248d between about 10 nm to about 20 nm and a fourth metal trace length 246d. In some embodiments, the dielectric layer 236 has a third dielectric layer width 250c between the third metal trace 238c and the fourth metal trace 238d between about 10 nm to about 20 nm. In some embodiments, the fourth metal trace length 246d is at least one of greater then, equal to or less than the first metal trace length 246a. In some embodiments, a fifth metal trace 238e has a fifth metal trace width 248e between about 10 nm to about 20 nm and a fifth metal trace length 246e. In some embodiments, the dielectric layer 236 has the third dielectric layer width 250c between the fifth metal trace 238e and the third metal trace 238c between about 10 nm to about 20 nm. In some embodiments, the fifth metal trace length 246e is at least one of greater then, equal to or less than the first metal trace length 246a. In some embodiments, at least one of the first metal trace 238a, the second metal trace 238b, the third metal trace 238c, the fourth metal trace 238d or the fifth metal trace 238e comprises copper. In some embodiments, the dielectric layer 236 comprises an extremely low dielectric constant material having a dielectric constant of less than about 3. In some embodiments, at least one of a bottom surface of the first metal trace 238a, a bottom surface of the second metal trace 238b, a bottom surface of the third metal trace 238c, a bottom surface of the fourth metal trace 238d or a bottom surface of the fifth metal trace 238e is in contact with an inter metal dielectric (IMD) layer 234. In some embodiments, the semiconductor arrangement 200 with metal trace widths less than 20 nm forms a smaller semiconductor arrangement than an arrangement that has metal trace widths greater than 20 nm.

Figure 2:
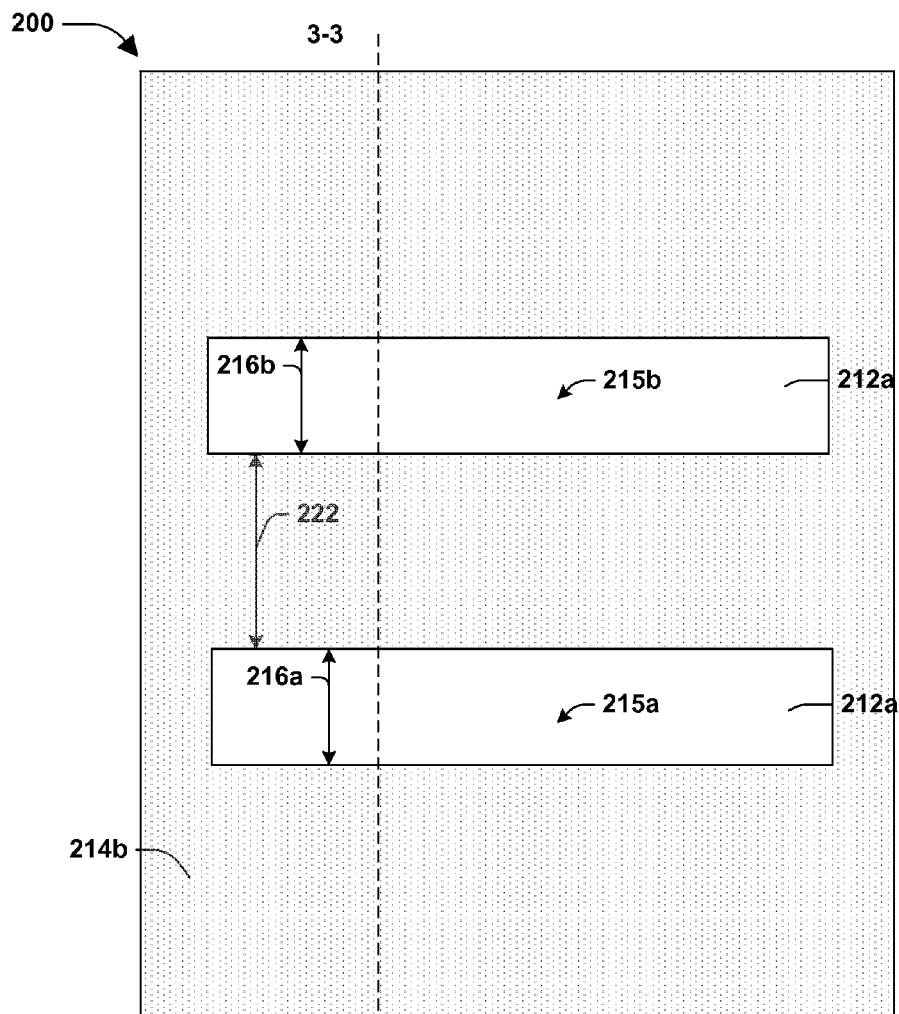
FIG. 2 is an illustration of a semiconductor arrangement, in accordance with some embodiments.
Figure 3:
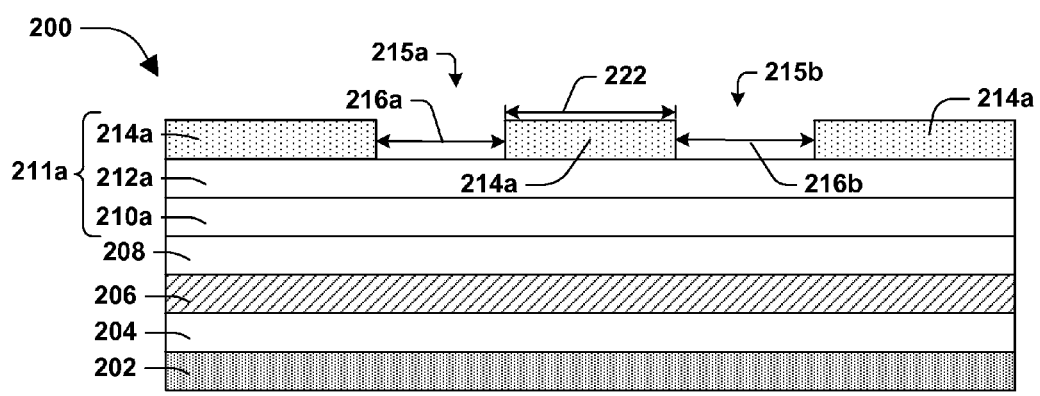
FIG. 3 is an illustration of a semiconductor arrangement, in accordance with some embodiments.
Figure 4:
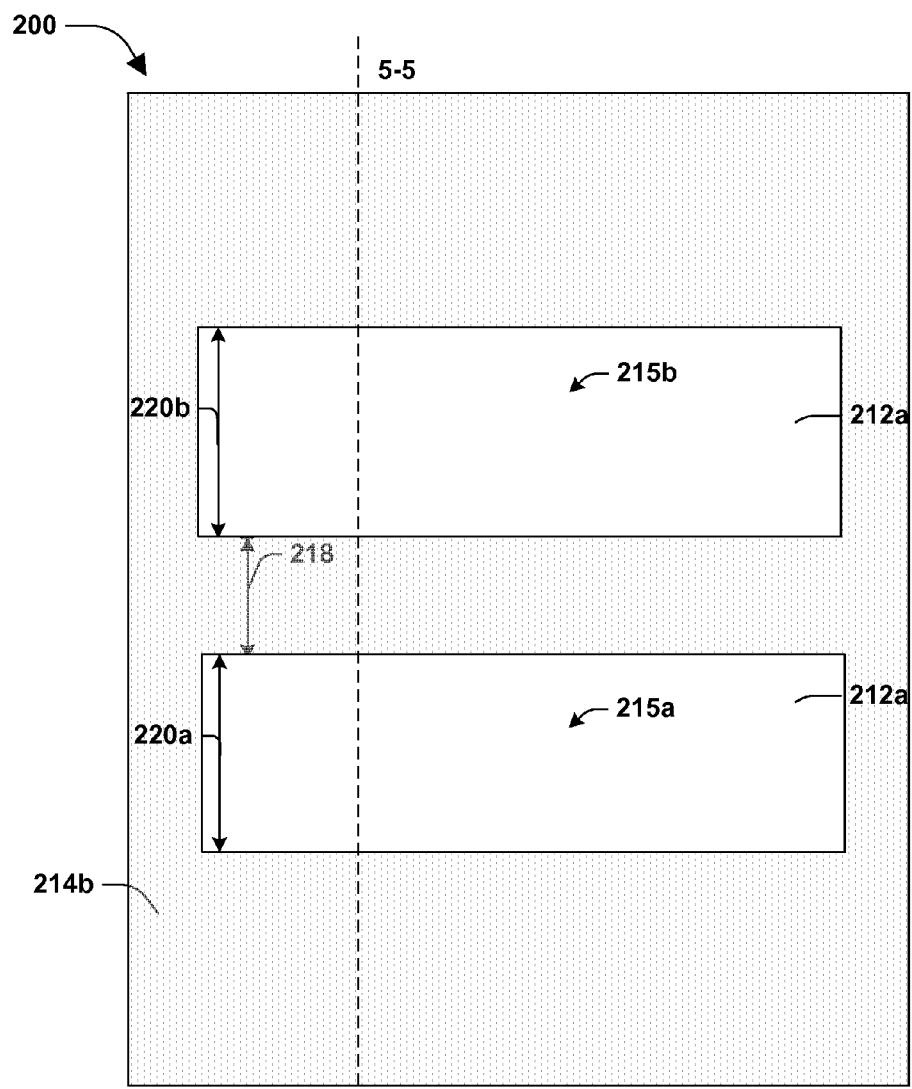
FIG. 4 is an illustration of a semiconductor arrangement, in accordance with some embodiments.
Figure 5:
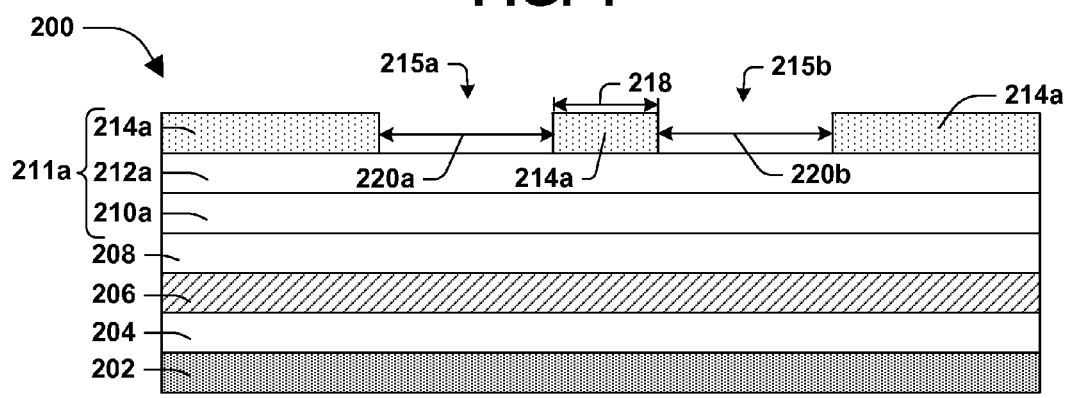
FIG. 5 is an illustration of a semiconductor arrangement, in accordance with some embodiments.
Figure 6:
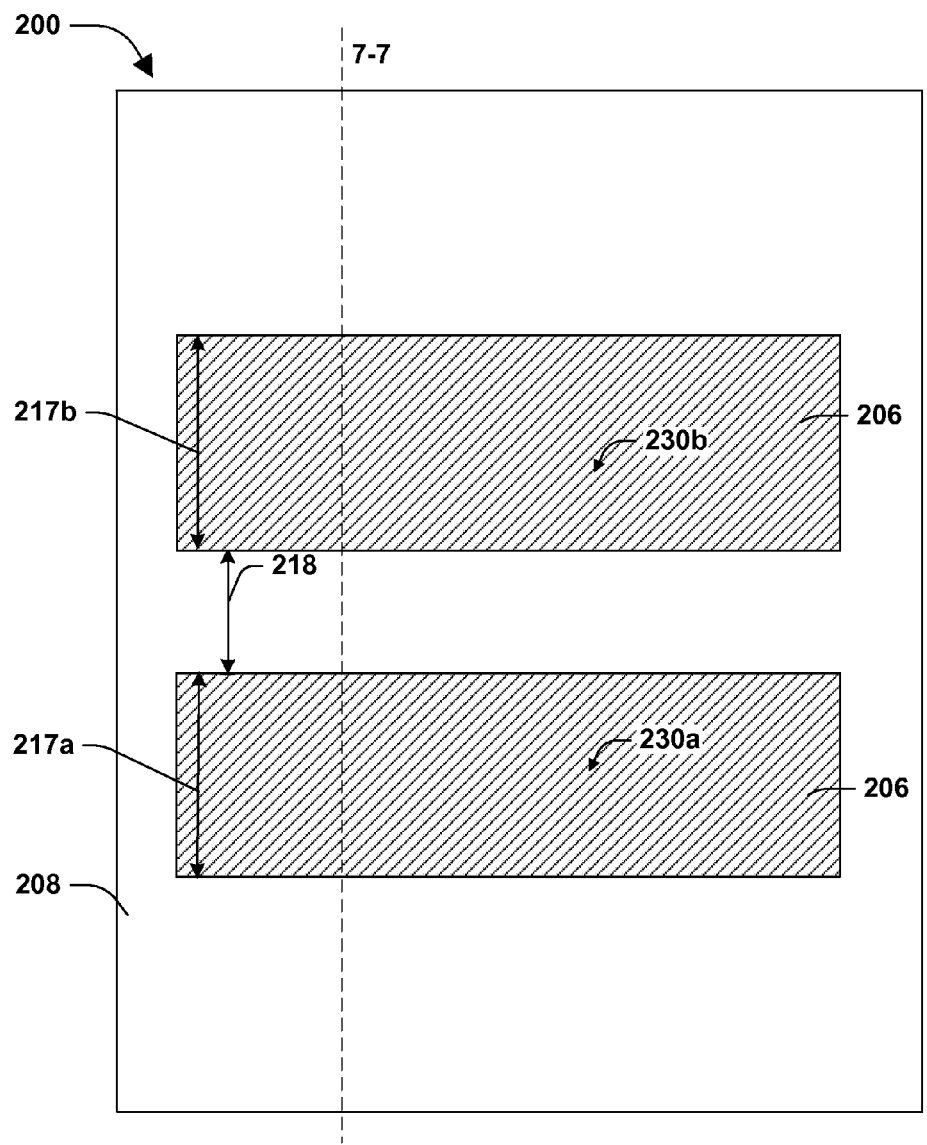
FIG. 6 is an illustration of a semiconductor arrangement, in accordance with some embodiments.
Figure 7:
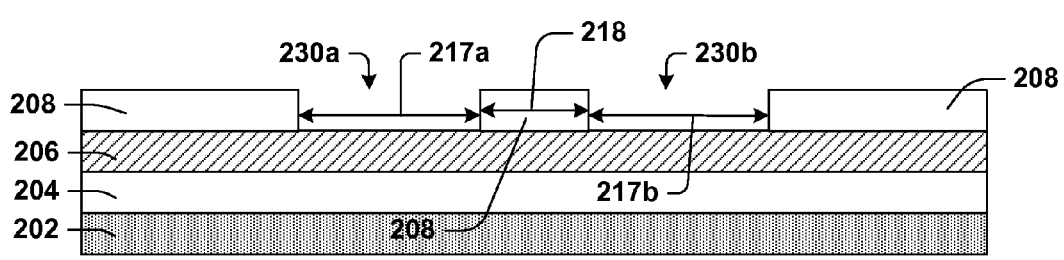
FIG. 7 is an illustration of a semiconductor arrangement, in accordance with some embodiments.
Figure 8:
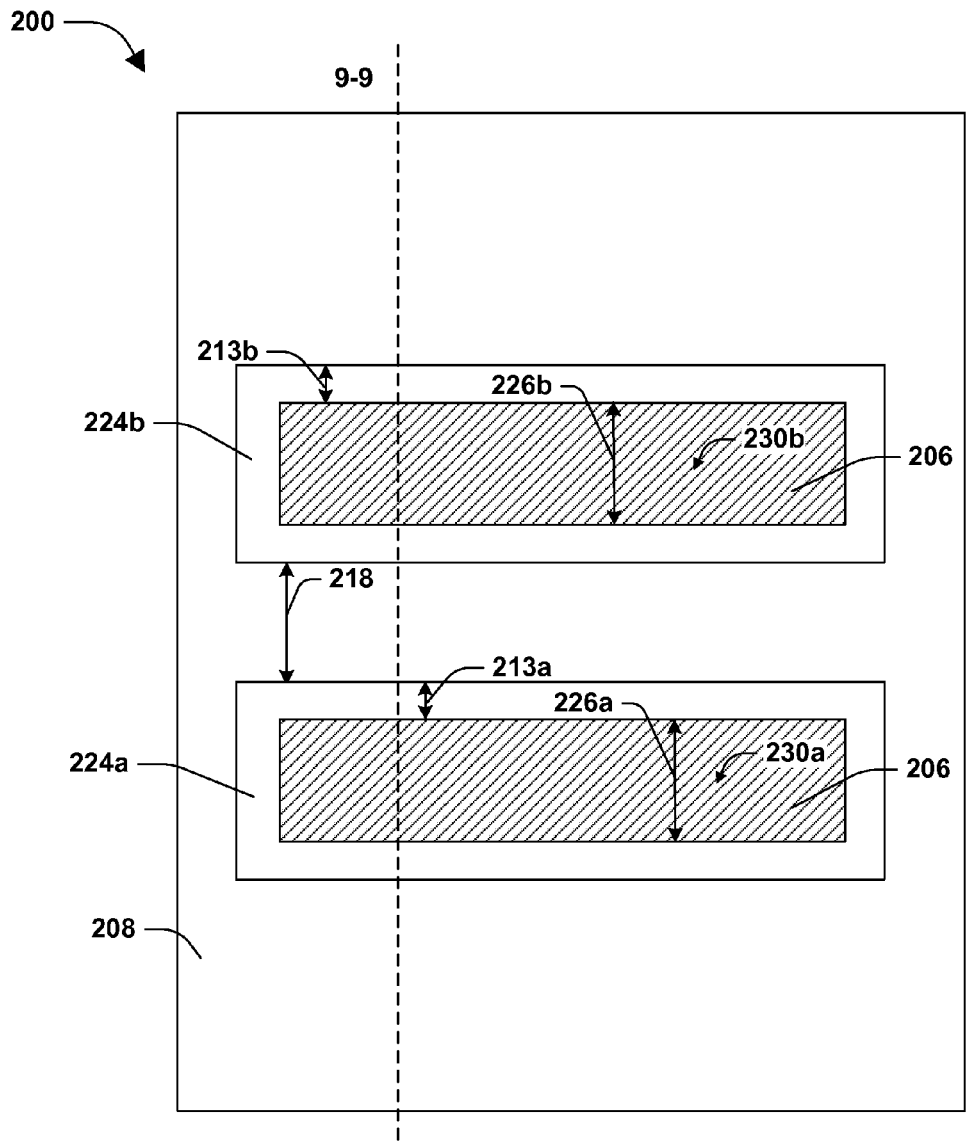
FIG. 8 is an illustration of a semiconductor arrangement, in accordance with some embodiments.
Figure 9:
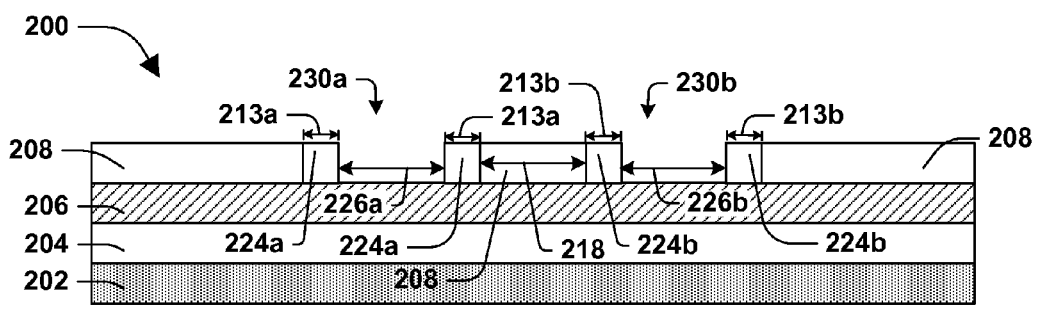
FIG. 9 is an illustration of a semiconductor arrangement, in accordance with some embodiments.

At 102 of method 100, as illustrated in FIGS. 8 and 9, where FIG. 8 illustrates a top down or overview of the semiconductor arrangement 200, and FIG. 9 illustrates a cross section of FIG. 8 along a line 9-9, a first spacer 224a is formed on sidewalls defining a first opening 230a in a first layer 208 over a hard mask 206, where a first opening width 217a, as illustrated in FIGS. 6 and 7, of the first opening 230a is about 5 times a first width 213a of the first spacer 224a, where the first width 213a of the first spacer 224a is between about 10 nm to about 20 nm, according to some embodiments. Turning to FIGS. 2 and 3, where FIG. 2 illustrates a top down or overview of the semiconductor arrangement 200 and FIG. 3 illustrates a cross section of FIG. 2 along a line 3-3, an initial metal layer 204 is over an oxide layer 202. In some embodiments, the oxide layer 202 comprises nitrogen free anti-reflecting coating (ARC). In some embodiments, the initial metal layer 204 comprises at least one of titanium or nitride. In some embodiments, the hard mask 206 is over the initial metal layer 204. In some embodiments, the first layer 208 is over the hard mask 206. In some embodiments, the first layer 208 comprises silicon, such as amorphous silicon. In some embodiments, a first photoresist composite 211a is formed over the first layer 208. In some embodiments, the first photoresist composite 211a comprises a first middle layer 212a over a first bottom layer 210a and a first photoresist 214a over the first middle layer 212a. In some embodiments, the first bottom layer 210a comprises carbon, such as a carbon polymer. In some embodiments, the first middle layer 212a comprises a spun on oxide. In some embodiments, a first photoresist opening 215a is formed in the first photoresist 214a using a first mask, the first photoresist 214a having an initial first photoresist opening width 216a between about 30 nm to about 60 nm. In some embodiments, a first layer photoresist opening 215b is formed in the first photoresist 214a having an initial first layer photoresist opening width 216b between about 30 nm to about 60 nm. In some embodiments, the first photoresist 214a between the first photoresist opening 215a and the first layer photoresist opening 215b has an initial first photoresist separation width 222 between about 50 nm to about 100 nm. Turning to FIGS. 4 and 5, where FIG. 4 illustrates a top down or overview of the semiconductor arrangement 200, and FIG. 5 illustrates a cross section of FIG. 4 along a line 5-5, the first photoresist opening 215a is expanded such that the initial first photoresist opening width 216a is increased to a first photoresist opening width 220a between about 50 nm to about 100 nm. In some embodiments, the first layer photoresist opening 215b is expanded such that the initial first layer photoresist opening width 216b is increased to a first layer photoresist opening width 220b between about 50 nm to about 100 nm. In some embodiments, the initial first photoresist separation width 222 is decreased to a first photoresist separation width 218 between about 30 nm to about 60 nm. In some embodiments, the first middle layer 212a is etched to form openings that expose the first bottom layer 210a, where the openings in the first middle layer 212a corresponding to the openings 215a and 215b. In some embodiments, the first photoresist 214a is removed. In some embodiments, the first bottom layer 210a is etched to form openings that expose the first layer 208, where the openings in the first bottom layer 210a correspond to the openings 215a and 215b. In some embodiments, the first middle layer 212a is removed. In some embodiments, as illustrated in FIGS. 6 and 7, where FIG. 6 illustrates a top down or overview of the semiconductor arrangement 200, and FIG. 7 illustrates a cross section of FIG. 6 along a line 7-7, the first layer 208 is etched to form the first opening 230a in the first layer 208a such that the hard mask 206 is exposed. In some embodiments, the first opening 230a corresponds to the first photoresist opening 215a and has the first opening width 217a substantially equal to the first photoresist opening width 220a. In some embodiments, the first layer 208 is etched to form a first layer opening 230b in the first layer 208a, such that the hard mask 206 is exposed. In some embodiments, the first layer opening 230b corresponds to the first layer photoresist opening 215b and has a first layer opening width 217b substantially equal to the first layer photoresist opening width 220b. In some embodiments, the first bottom layer 210a is removed. In some embodiments, as illustrated in FIGS. 8 and 9, the first spacer 224a is formed on sidewalls defining the first opening 230a over the hard mask 206. In some embodiments, a second spacer 224b is formed on sidewalls defining the first layer opening 230b over the hard mask 206. In some embodiments, the first layer opening width 217b of the first opening 230a is about 5 times a second width 213b of the second spacer 224b. In some embodiments, the second width 213b of the second spacer 224b is between about 10 nm to about 20 nm. In some embodiments, such as illustrated in FIGS. 8 and 9, the addition of the first spacer 224a to the first opening 230a reduces the first opening width 217a to a reduced first opening width 226a about 3 times the first width 213a of the first spacer 224a. In some embodiments, the addition of the second spacer 224b to the first layer opening 230b reduces the first layer opening width 217b to a reduced first layer opening width 226b about 3 times the second width 213b of the second spacer 224b. In some embodiments, at least one of the first spacer 224a or the second spacer 224b comprises nitride.

Figure 10:
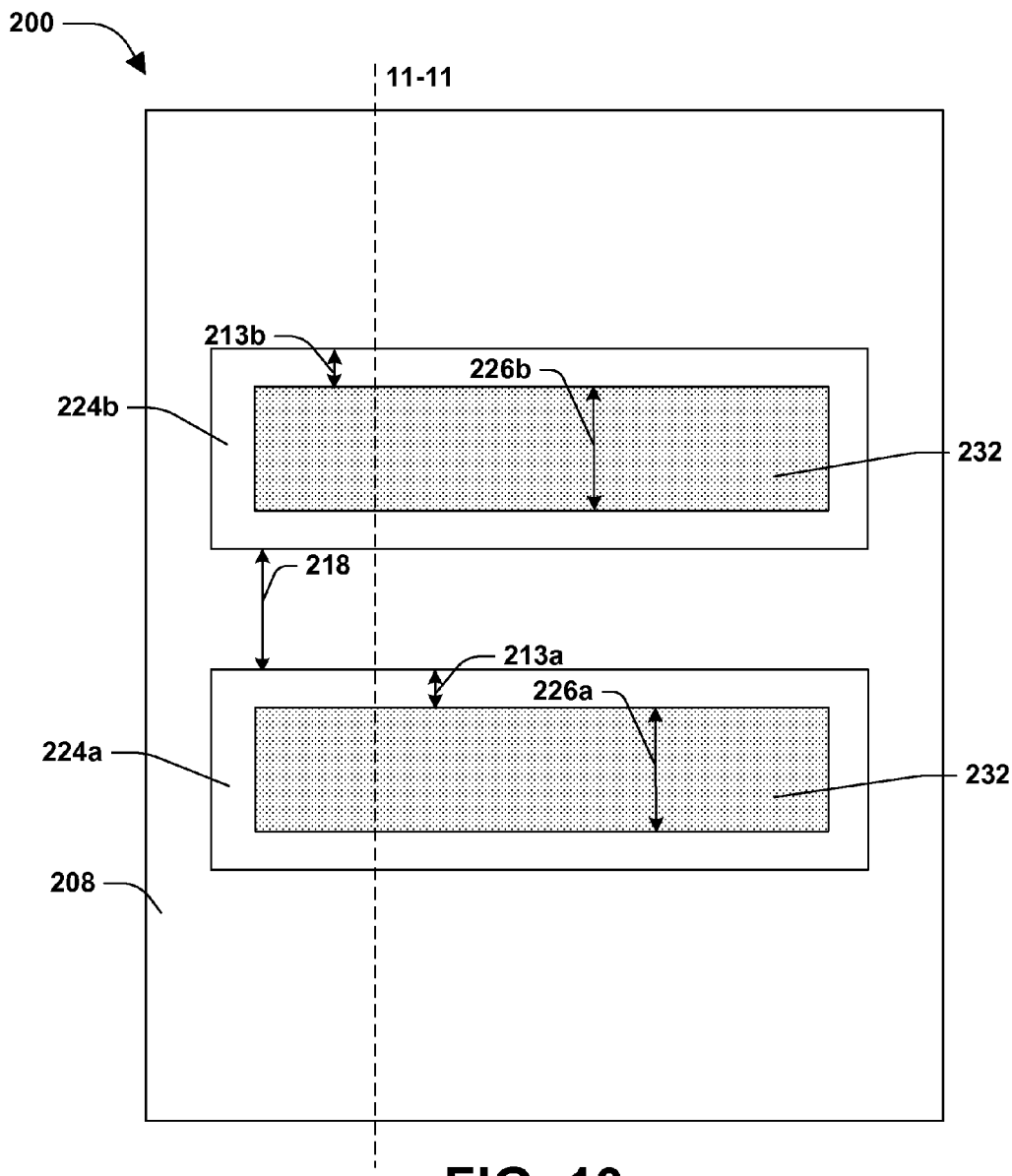
FIG. 10 is an illustration of a semiconductor arrangement, in accordance with some embodiments.
Figure 11:
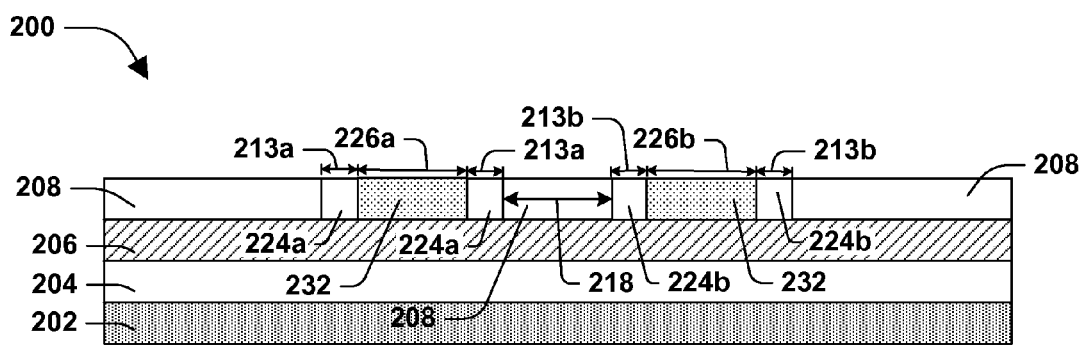
FIG. 11 is an illustration of a semiconductor arrangement, in accordance with some embodiments.

At 104 of method 100, as illustrated in FIGS. 10 and 11, where FIG. 10 illustrates a top down or overview of the semiconductor arrangement 200 and FIG. 11 illustrates a cross section of FIG. 10 along a line 11-11, a first metal oxide layer 232 is formed in the first opening 230a, according to some embodiments. In some embodiments, the first metal oxide layer 232 is formed in the first layer opening 230b. In some embodiments, the first metal oxide layer 232 in the first opening 230a has a width equal to the reduced first opening width 226a. In some embodiments, the first metal oxide layer 232 in the first layer opening 230b has a width equal to the reduced first layer opening width 226b. In some embodiments, the first metal oxide layer 232 comprises at least one of titanium or oxide. In some embodiments, the first metal oxide layer 232 is formed by atomic layer deposition (ALD).

Figure 12:
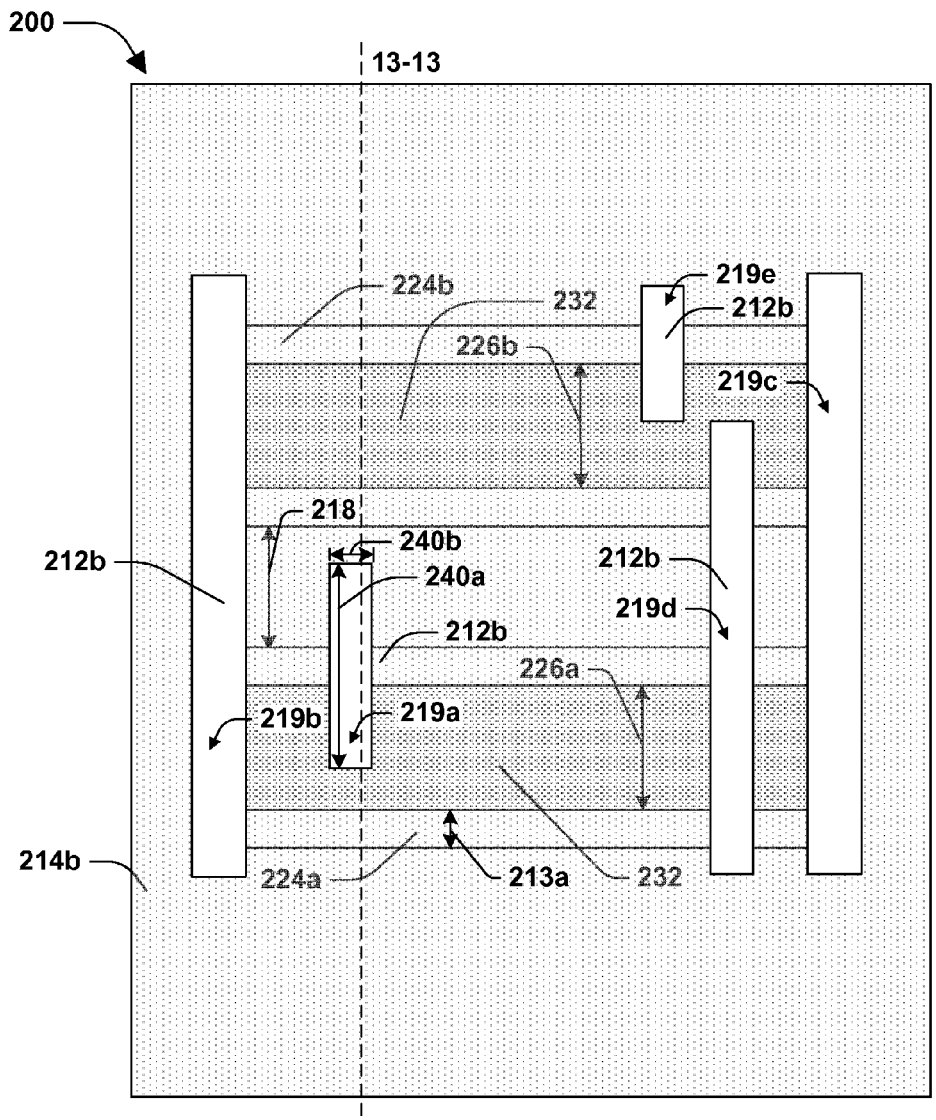
FIG. 12 is an illustration of a semiconductor arrangement, in accordance with some embodiments.
Figure 13:
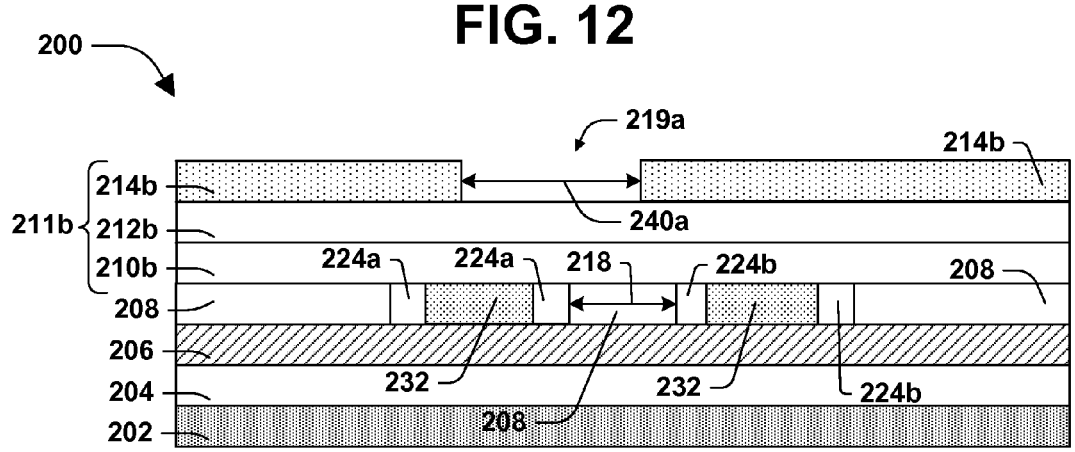
FIG. 13 is an illustration of a semiconductor arrangement, in accordance with some embodiments.
Figure 14:
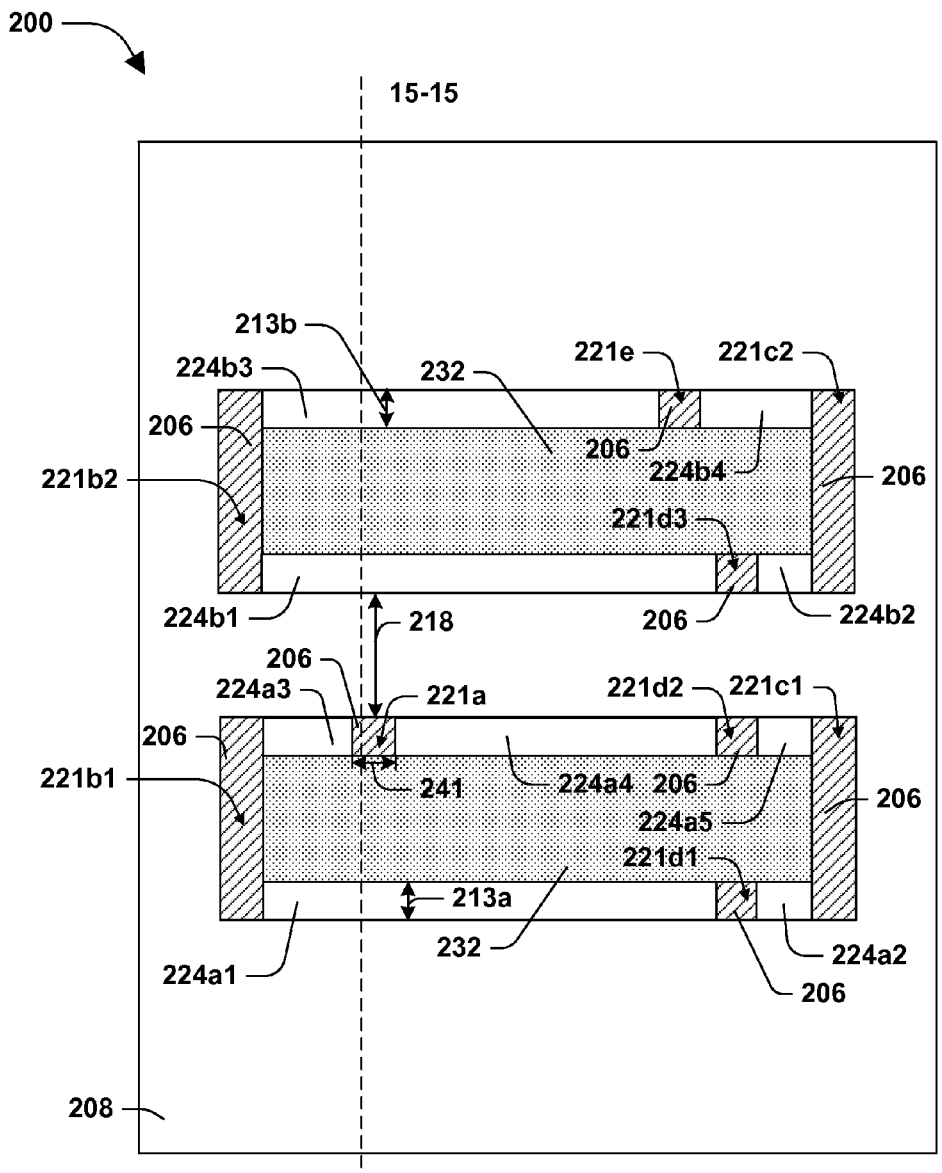
FIG. 14 is an illustration of a semiconductor arrangement, in accordance with some embodiments.
Figure 15:
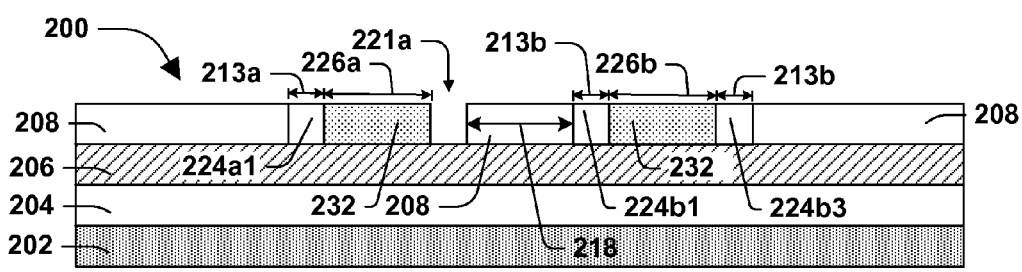
FIG. 15 is an illustration of a semiconductor arrangement, in accordance with some embodiments.

At 106 of method 100, as illustrated in FIGS. 14 and 15, where FIG. 14 illustrates a top down or overview of the semiconductor arrangement 200, and FIG. 15 illustrates a cross section of FIG. 14 along a line 15-15, a first line opening 221a is formed in the first spacer 224a to expose the hard mask 206, the first line opening 221a having a first line opening length 241 substantially equal to the first width 213a of the first spacer 224a, a first end opening 221b1 is formed in the first spacer 224a and a second end opening 221c1 is formed in the first spacer 224a such that the first spacer 224a comprises two separate portions on opposing sidewalls of the first opening 230a, according to some embodiments. Turning to FIGS. 12 and 13, prior to FIGS. 14 and 15, where FIG. 12 illustrates a top down or overview of the semiconductor arrangement 200, and FIG. 13 illustrates a cross section of FIG. 12 along a line 13-13, a second photoresist composite 211b is formed over the first layer 208, the first spacer 224a, the metal oxide layer 232 and the second spacer 224b, according to some embodiments. In some embodiments, the second photoresist composite 211b comprises a second photoresist 214b, a second middle layer 212b and a second bottom layer 210b having the same composition as the first photoresist composite 211a comprising the first photoresist 214a, the first middle layer 212a and the first bottom layer 210a, as illustrated in FIGS. 4 and 5. In some embodiments, a first photoresist line opening 219a over the first spacer 224a, a first photoresist end opening 219b over the first spacer 224a and the second spacer 224b, a second photoresist end opening 219c over the first spacer 224a and the second spacer 224b, a second photoresist line opening 219d over the first spacer 224a and the second spacer 224b and a third photoresist line opening 219e over the second spacer 224b are formed in the second photoresist 214b. In some embodiments, at least one of the first photoresist line opening 219a, the first photoresist end opening 219b, the second photoresist end opening 219c, the second photoresist line opening 219d or the third photoresist line opening 219e is formed using a second mask. In some embodiments, the first photoresist line opening 219a has a first photoresist line opening width 240a about 5 times the first width 213a of the first spacer 224a. In some embodiments, the first photoresist line opening 219a has a first photoresist line opening length 240b substantially equal to the first width 213a of the first spacer 224a. In some embodiments, at least one of the first photoresist end opening 219b, the second photoresist end opening 219c, the second photoresist line opening 219d or the third photoresist line opening 219e have a length substantially equal to the first width 213a of the first spacer 224a. Turning to FIGS. 14 and 15, the first line opening 221a is formed by using the first photoresist line opening 219a as a pattern to etch the second middle layer 212b, the second bottom layer 210b and the first spacer 224a in the same manner as described above with regard to the first opening 230a, as illustrated in FIGS. 4-7, according to some embodiments. In some embodiments, the first end opening 221b1, illustrated in FIG. 14, is formed by using the first photoresist end opening 219b as a pattern to etch the second middle layer 212b, the bottom layer 210b and the first spacer 224a and the first end opening 221b2 is formed by using the first photoresist end opening 219b as a pattern to etch the second middle layer 212b, the bottom layer 210b and the second spacer 224b in the same manner as described above with regard to the first opening 230a, as illustrated in FIGS. 4-7. In some embodiments, the second end opening 221c1 is formed in the first spacer 224a by etching the second middle layer 212b, the bottom layer 210b and the first spacer 224a through the second photoresist end opening 219c and a second end opening 221c2 is formed in the second spacer 224b by etching the second middle layer 212b, the bottom layer 210b and the second spacer 224b through the second photoresist end opening 219c in the same manner as described above with regard the first opening 230a, as illustrated in FIGS. 4-7. In some embodiments, a second line opening 221d1 and a third line opening 221d2 are formed in the first spacer 224a by etching the second middle layer 212b, the bottom layer 210b and the first spacer 224a through the second photoresist line opening 219d and a fourth line opening 221d3 is formed in the second spacer 224b by etching the second middle layer 212b, the bottom layer 210b and the second spacer 224b through the second photoresist line opening 219d in the same manner as described above with regards to the first opening 230a, as illustrated in FIGS. 4-7. In some embodiments, a fifth line opening 221e is formed in the second spacer 224b by etching the second middle layer 212b, the bottom layer 210b and the second spacer 224b through the third photoresist line opening 219e in the same manner as described above with regard to the first opening 230a, as illustrated in FIGS. 4-7. In some embodiments, at least one of the first end opening 221b1 in the first spacer 224a, the first end opening 221b2 in the second spacer 224b, the second end opening 221c1 in the first spacer 224a, the second end opening 221c2 in the second spacer 224b, the second line opening 221d1, the third line opening 221d2, the fourth line opening 221d3 or the fifth line opening 221e have a length that is substantially equal to the first line opening length 241. In some embodiments, forming at least one of the first line opening 221a, the first end opening 221b1 in the first spacer 224a, the first end opening 221b2 in the second spacer 224b, the second line opening 221d1, the second end opening 221c1 in the first spacer 224a, the second end opening 221c2 in the second spacer 224b, the second line opening 221d1, the third line opening 221d2, the fourth line opening 221d3 or the fifth line opening 221e comprises exposing the hard mask 206 under at least one of the first spacer 224a or the second spacer 224b. In some embodiments, the formation of the first line opening 221a, the first end opening 221b1 in the first spacer 224a, the second line opening 221d1, the second end opening 221c1 in the first spacer 224a and the third line opening 221d2 forms a first portion of the first spacer 224a1, a second portion of the first spacer 224a2, a third portion of the first spacer 224a3, a fourth portion of the first spacer 224a4 and a fifth portion of the first spacer 224*a*5. In some embodiments, the first portion of the first spacer 224*a*1 and the second portion of the first spacer 224*a*2 are diametrically opposed to the third portion of the first spacer 224*a*3, the fourth portion of the first spacer 224*a*4 and the fifth portion of the first spacer 224*a*5. In some embodiments, the fourth line opening 221*d*3, the fifth line opening 221*e*, the first end opening 221*b*2 in the second spacer 224*b* and the second end opening 221*c*2 in the second spacer 224*b* forms a first portion of the second spacer 224*b*1, a second portion of the second spacer 224*b*2, a third portion of the second spacer 224*b*3, and a fourth portion of the second spacer 224*b*4. In some embodiments, the first portion of the second spacer 224*b*1 and the second portion of the second spacer 224*b*2 are diametrically opposed to the third portion of the second spacer 224*b*3 and the fourth portion of the second spacer 224*b*4.

Figure 16:
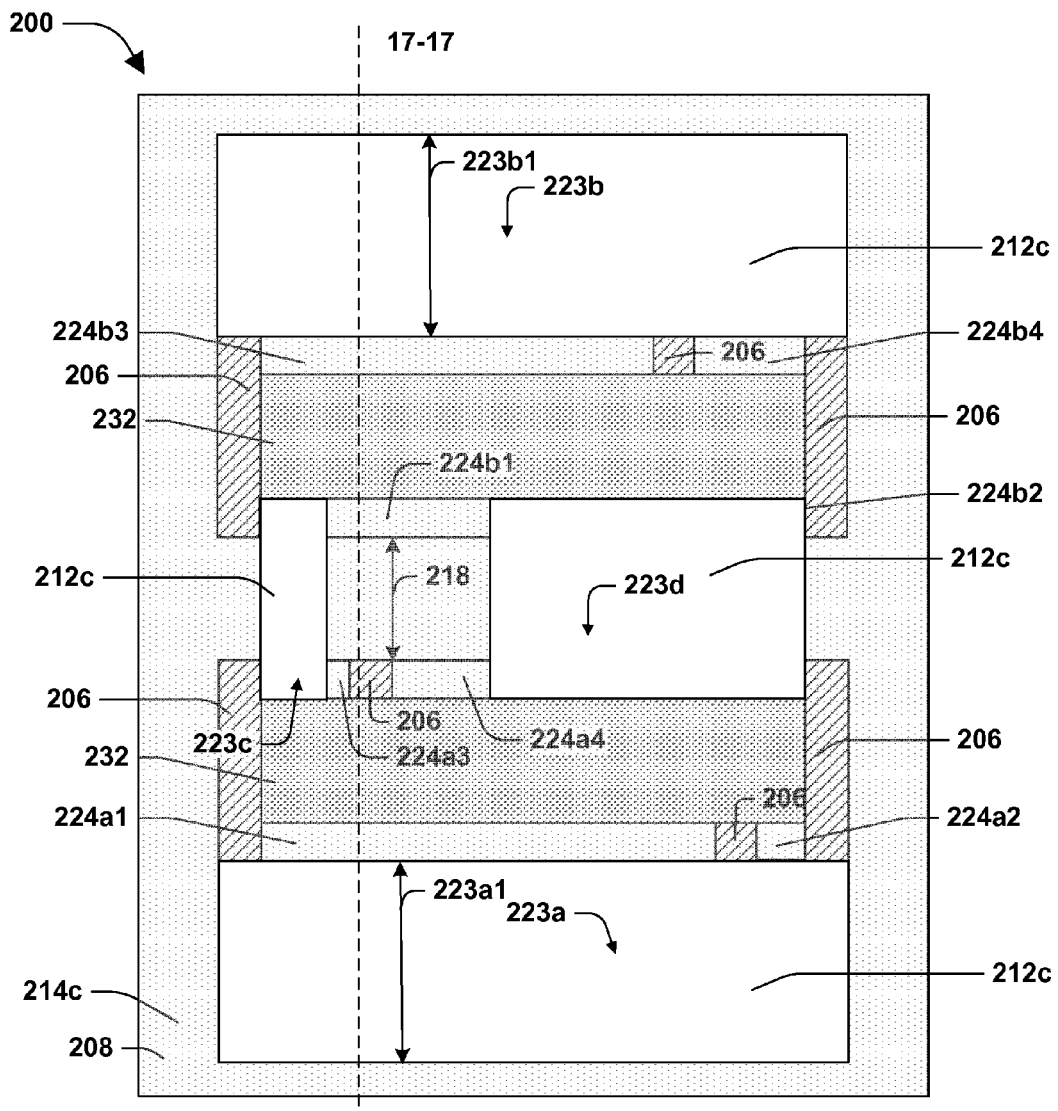
FIG. 16 is an illustration of a semiconductor arrangement, in accordance with some embodiments.
Figure 17:
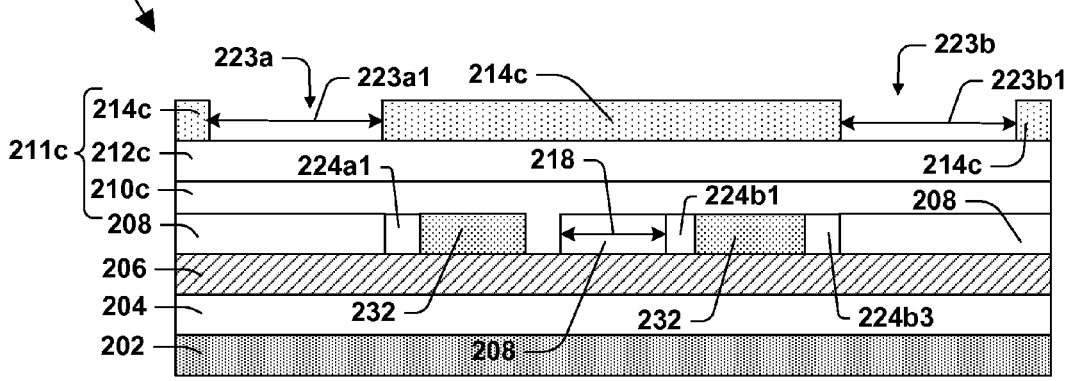
FIG. 17 is an illustration of a semiconductor arrangement, in accordance with some embodiments.
Figure 18:
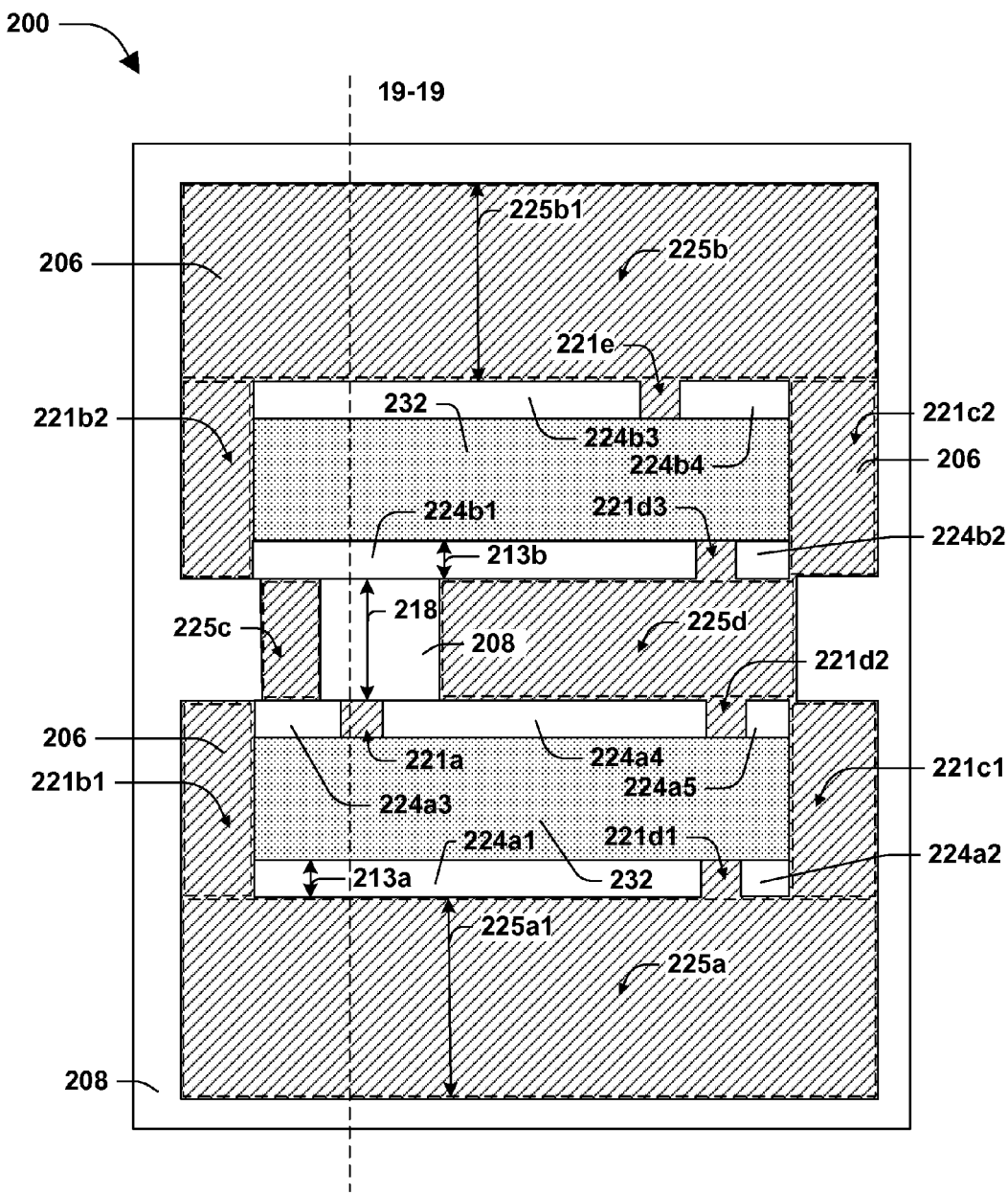
FIG. 18 is an illustration of a semiconductor arrangement, in accordance with some embodiments.
Figure 19:
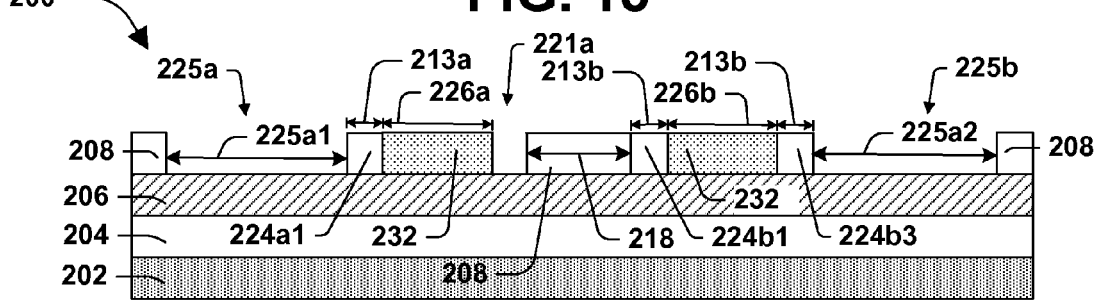
FIG. 19 is an illustration of a semiconductor arrangement, in accordance with some embodiments.

At 108 of method 100, as illustrated in FIGS. 18 and 19, where FIG. 18 illustrates a top down or overview of the semiconductor arrangement 200, and FIG. 19 illustrates a cross section of FIG. 18 along a line 19-19, a second opening 225*a* is formed in the first layer 208 adjacent the first metal oxide layer 232 in the first opening 230*a*. In some embodiments, the second opening 225*a* has a second opening width 225*a*1 about 5 times the first line opening length 241, according to some embodiments. Turning to FIGS. 16 and 17, prior to FIGS. 18 and 19, where FIG. 16 illustrates a top down or overview of the semiconductor arrangement 200, and FIG. 17 illustrates a cross section of FIG. 16 along a line 17-17, a third semiconductor composite 211*c* is formed over the first layer 208, the first spacer 224*a*, the second spacer 224*a*, the first metal oxide layer 232 and the hard mask 206, according to some embodiments. In some embodiments, the third photoresist composite 211*c* comprises a third photoresist 214*c*, a third middle layer 212*c*, and a third bottom layer 210*c* having the same composition as the first photoresist composite 211*a* comprising the first photoresist 214*a*, the first middle layer 212*a* and the first bottom layer 210*a*, as illustrated in FIGS. 4 and 5. In some embodiments, a second photoresist opening 223*a* is formed over the first layer 208 adjacent the first portion of the first spacer 224*a*1 and the second portion of the first spacer 224*a*2. In some embodiments, a fourth photoresist opening 223*b* is formed over the first layer 208 adjacent the third portion of the second spacer 224*b*3 and the fourth portion of the second spacer 224*b*4. In some embodiments, a fifth photoresist opening 223*c* is formed over the first layer 208, the third portion of the first spacer 224*a*3 and the first portion of the second spacer 224*b*1. In some embodiments, a sixth photoresist opening 223*d* is formed over the fourth portion of the first spacer 224*a*4, the fifth portion of the first spacer 224*a*5 and the second portion of the second spacer 224*b*2. In some embodiments, at least one of the second photoresist opening 223*a*, the fourth photoresist opening 223*b*, the fifth photoresist opening 223*c* or the sixth photoresist opening 223*d* are formed in the third photoresist 214*c* using a third mask. In some embodiments, the second photoresist opening 223*a* has a second photoresist opening width 223*a*1 about 5 times the first line opening length 241. In some embodiments, the fourth photoresist opening 223*b* has a fourth photoresist opening width 223*b*1 about 5 times the first line opening length 241. In some embodiments, at least one of the fifth photoresist opening 223*c* or the sixth photoresist opening 223*d* have a width about 5 times the first line opening length 241. Turning to FIGS. 18 and 19, the second opening 225*a* is formed by etching the third middle layer 212*c*, the third bottom layer 210*c* and the first layer 208 through the second photoresist opening 223*a* in the same manner as described above with regards to the first opening 230*a*, as illustrated in FIGS. 4-7, according to some embodiments. In some embodiments, a fourth opening 225*b* is formed by etching the third middle layer 212*c*, the third bottom layer 210*c* and the first layer 208 through the fourth photoresist opening 223*b* in the same manner as described above with regards to the first opening 230*a*, as illustrated in FIGS. 4-7. In some embodiments, a fifth opening 225*c* is formed by etching the third middle layer 212*c*, the third bottom layer 210*c* and the first layer 208 through the fifth photoresist opening 223*c* in the same manner as described above with regards to the first opening 230*a*, as illustrated in FIGS. 4-7. In some embodiments, a sixth opening 225*d* is formed by etching the third middle layer 212*c*, the third bottom layer 210*c* and the first layer 208 through the sixth photoresist opening 223*d* in the same manner as described above with regards to the first opening 230*a*, as illustrated in FIGS. 4-7. In some embodiments, the second opening 225*a* has the second opening width 225*a*1 substantially equal to the second photoresist opening width 223*a*1. In some embodiments, the fourth opening 225*b* has the fourth opening width 225*b*1 substantially equal to the second photoresist opening width 223*a*1. In some embodiments, at least one of the fifth opening 225*c* or the sixth opening 225*d* have a width equal to the first photoresist separation width 218. In some embodiments, at least one of the second opening 225*a*, the fourth opening 225*b*, the fifth opening 225*c* or the sixth opening 225*d* expose the hard mask 206.

Figure 20:
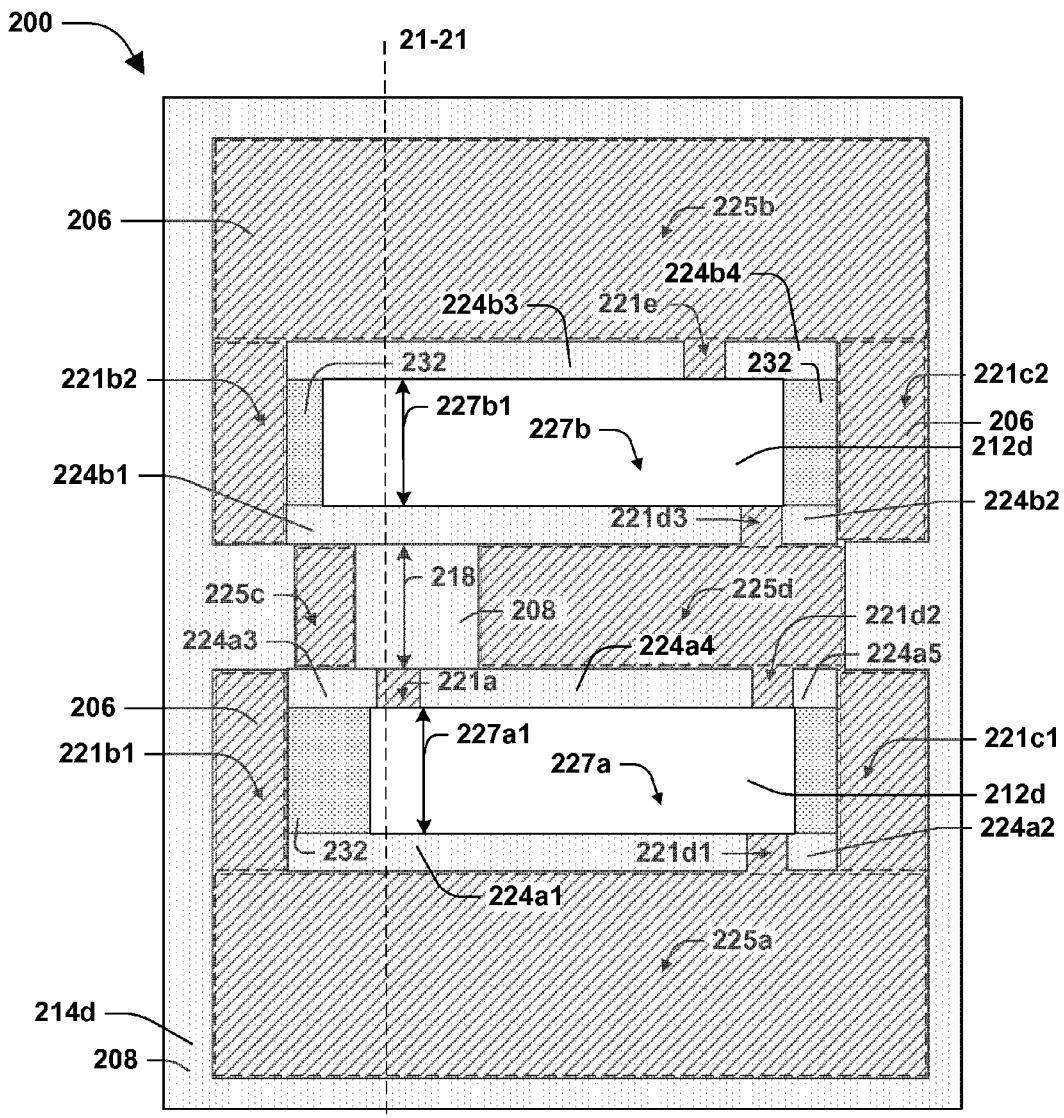
FIG. 20 is an illustration of a semiconductor arrangement, in accordance with some embodiments.
Figure 21:
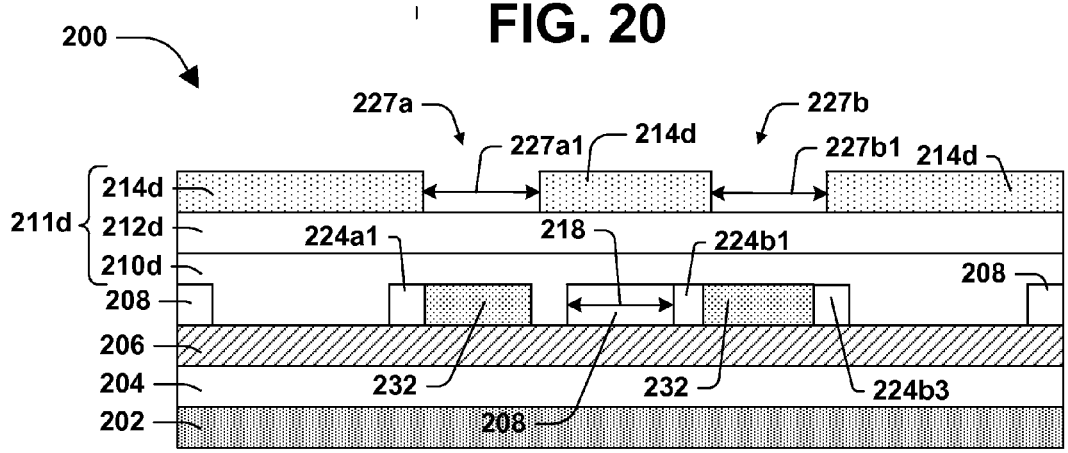
FIG. 21 is an illustration of a semiconductor arrangement, in accordance with some embodiments.
Figure 22:
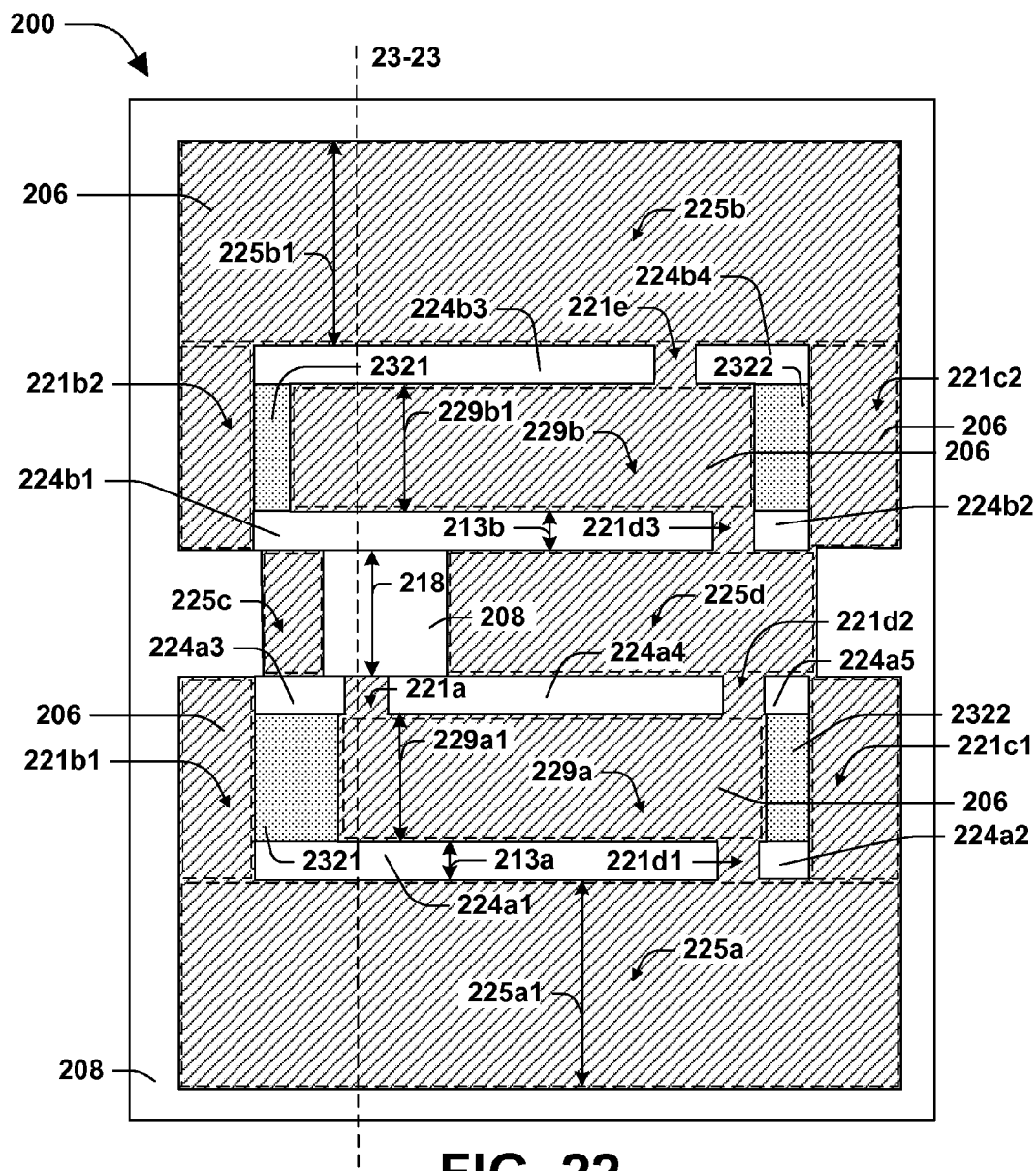
FIG. 22 is an illustration of a semiconductor arrangement, in accordance with some embodiments.
Figure 23:
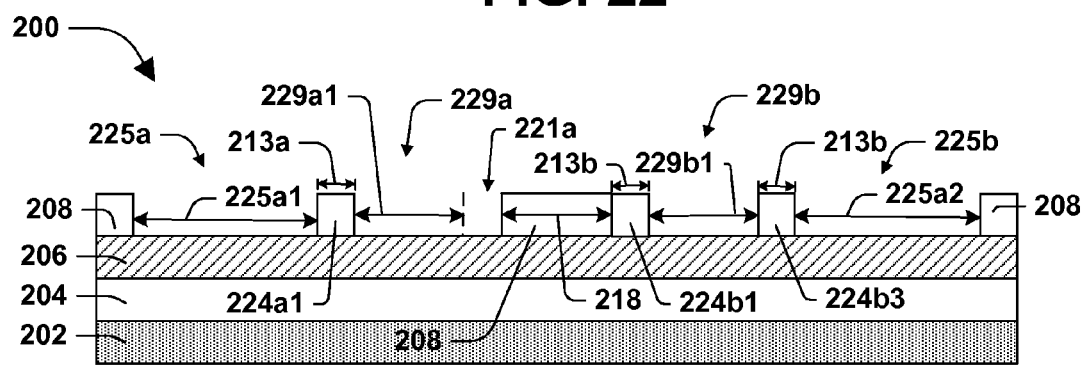
FIG. 23 is an illustration of a semiconductor arrangement, in accordance with some embodiments.

At 110 of method 100, as illustrated in FIGS. 22 and 23, where FIG. 22 illustrates a top down or overview of the semiconductor arrangement 200, and FIG. 23 illustrates a cross section of FIG. 22 along a line 23-23, a third opening 229*a* is formed by removing at least some of the first metal oxide layer 232 from first opening 230*a*, such that the third opening 229*a* has a third opening width 229*a*1, according to some embodiments. Turning to FIGS. 20 and 21, where FIG. 20 illustrates a top down or overview of the semiconductor arrangement 200, and FIG. 21 illustrates a cross section of FIG. 20 along a line 21-21, a fourth photoresist composite 211*d* is formed over the first layer 208, the first spacer 224*a*, the first metal oxide layer 232, the hard mask 206 and the second spacer 224*b*, according to some embodiments. In some embodiments, the fourth photoresist composite 211*d* comprises a fourth photoresist 214*d*, a fourth middle layer 212*d* and a fourth bottom layer 210*d* having the same composition as the first photoresist composite 211*a* comprising the first photoresist 214*a*, the first middle layer 212*a* and the first bottom layer 210*a*, as illustrated in FIGS. 4 and 5. In some embodiments, a third photoresist opening 227*a* is over at least some of the first metal oxide layer 232 in the first opening 230*a*. In some embodiments, the third photoresist opening 227*a* is formed in the fourth photoresist 214*b* using the first mask. In some embodiments, the third photoresist opening 227*a* has a third photoresist opening width 227*a*1 about 3 times the first width 213*a* of the first spacer 224*a*. In some embodiments, a seventh photoresist opening 227*b* is over at least some of the first metal oxide layer 232 in a seventh opening 229*b*. In some embodiments, the seventh photoresist opening 227*b* is formed in the fourth photoresist 214*b* using the first mask. In some embodiments, the seventh photoresist opening 227*b* has a seventh photoresist opening width 227*b*1 about 3 times the first width 213*a* of the first spacer 224*a*. Turning to FIGS. 22 and 23, the third opening 229*a* is formed by etching the fourth middle layer 212*d*, the fourth bottom layer 210*d* and the first metal oxide layer 232 through the third photoresist opening 227*a* in the same manner as described above with regards to the first opening 230*a*, as illustrated in FIGS. 4-7, according to some embodiments.

In some embodiments, the seventh opening 229b is formed by etching the fourth middle layer 212d, the fourth bottom layer 210d and the first metal oxide layer 232 through the seventh photoresist opening 227b in the same manner as described above with regard to the first opening 230a, as illustrated in FIGS. 4-7. In some embodiments, the third opening 229a has the third opening width 229a1 substantially equal to the third photoresist opening width 227a1. In some embodiments, the seventh opening 229b has a seventh opening width 229b1 substantially equal to the seventh photoresist opening width 227b1. In some embodiments, at least one of the third opening 229a or the seventh opening 229b exposes the hard mask 206.

Figure 24:
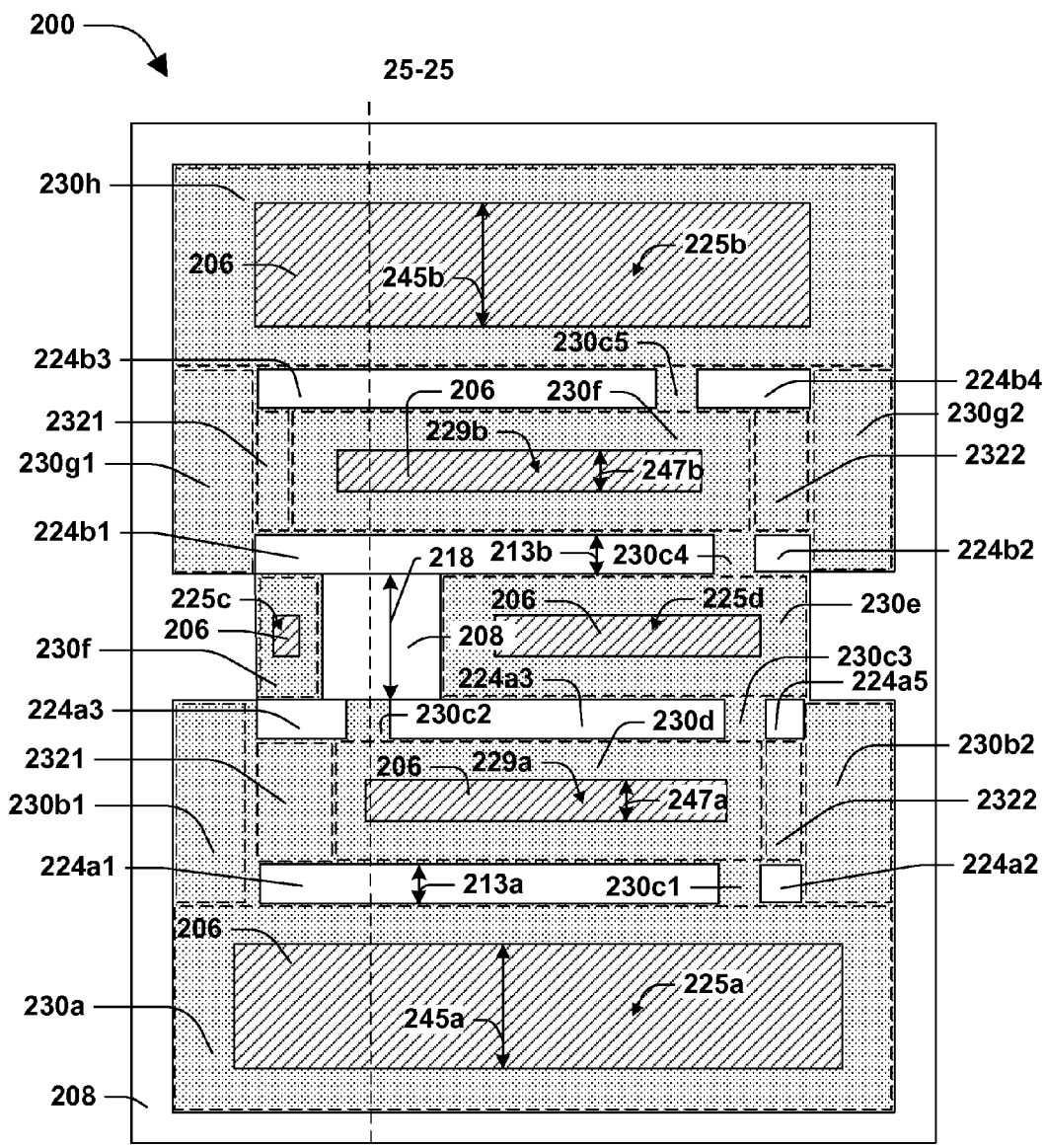
FIG. 24 is an illustration of a semiconductor arrangement, in accordance with some embodiments.
Figure 25:
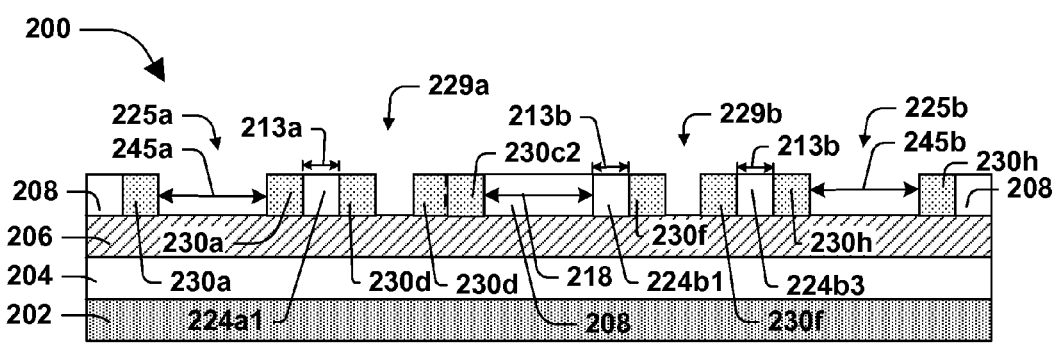
FIG. 25 is an illustration of a semiconductor arrangement, in accordance with some embodiments.

At 112 of method 100, as illustrated in FIGS. 24 and 25, where FIG. 24 illustrates a top down or overview of the semiconductor arrangement 200, and FIG. 25 illustrates a cross section of FIG. 24 along a line 25-25, a second metal oxide layer 230 is formed on sidewalls defining the second opening 225a, on sidewalls defining the third opening 229a, and in the first line opening 221a, according to some embodiments. In some embodiments, the second metal oxide layer 230 is formed on at least one of sidewalls defining the first end opening 221b1 formed in the first spacer 224a, on sidewalls defining the first end opening 221b2 formed in the second spacer 224b, on sidewalls defining the second end opening 221c1 formed in the first spacer 224a, on sidewalls defining the second end opening 221c2 formed on sidewalls defining the second spacer 224b, in the second line opening 221d1, in the third line opening 221d2, in the fourth line opening 221d2, in the fifth line opening 221de, on sidewalls defining the fourth opening 225b, on sidewalls defining the fifth opening 225c, on sidewalls defining the sixth opening 225d and on sidewalls defining the seventh opening 229b. In some embodiments, the second opening width 225a1 is reduced by the addition of the second metal oxide layer 230 such that the second opening 225a has a reduced second opening width 245a about 3 times the first line opening length 241. In some embodiments, the fourth opening width 225b1 is reduced by the addition of the second metal oxide layer 230 such that the fourth opening 225b has a reduced fourth opening width 245b about 3 times the first line opening length 241. In some embodiments, the third opening width 229a1 is reduced by the addition of the second metal oxide layer 230 such that the third opening 229a has a reduced third opening width 247a substantially equal to the first line opening length 241. In some embodiments, the seventh opening width 229b1 is reduced by the addition of the second metal oxide layer 230 such that the seventh opening 229b has a reduced seventh opening width 247b substantially equal to the first line opening length 241. In some embodiments, a width of at least one of the fifth opening 225c or the sixth opening 225d is reduced such that a reduced width of at least one of the fifth opening 225c or the sixth opening 225d is substantially equal to the first line opening length 241.

Figure 26:
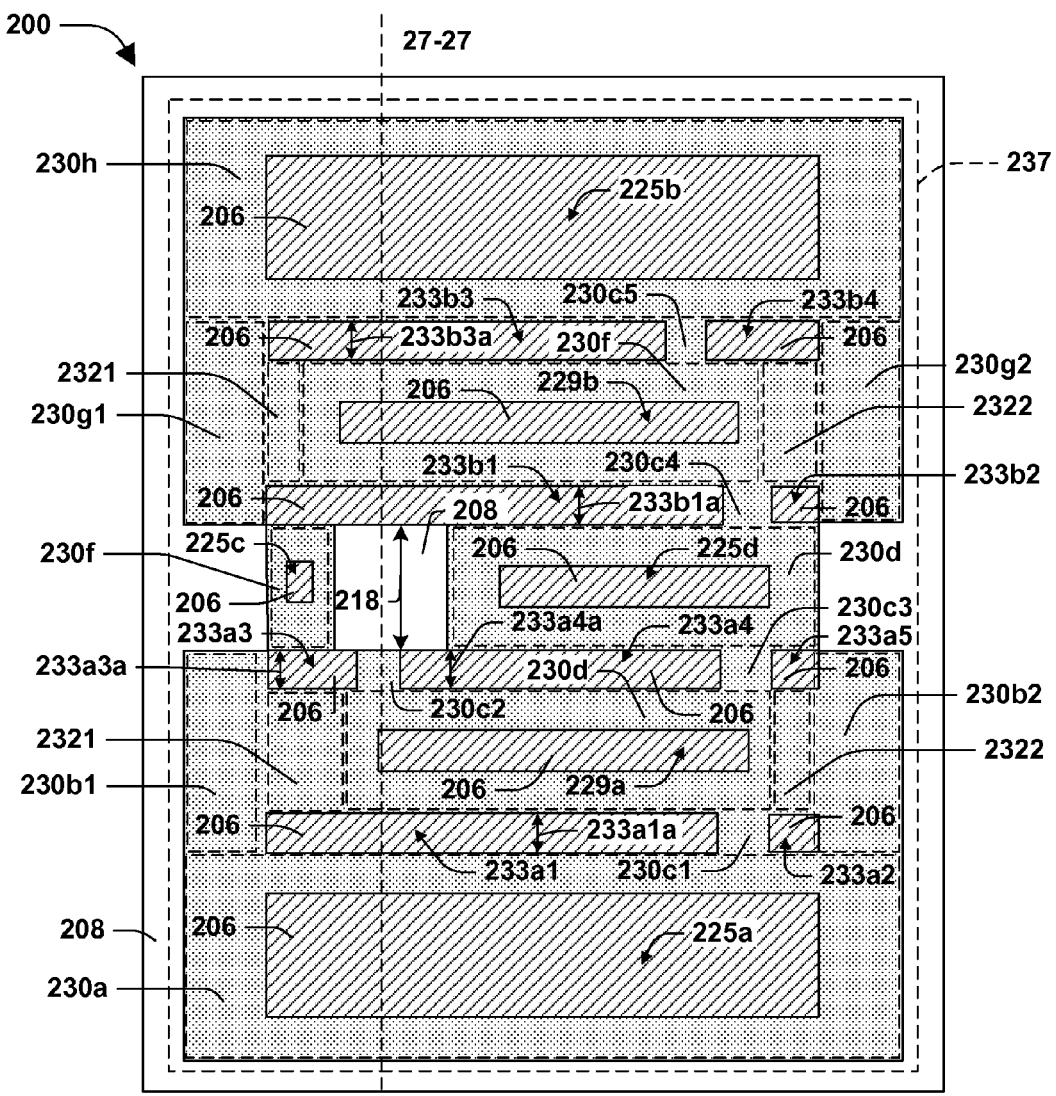
FIG. 26 is an illustration of a semiconductor arrangement, in accordance with some embodiments.
Figure 27:
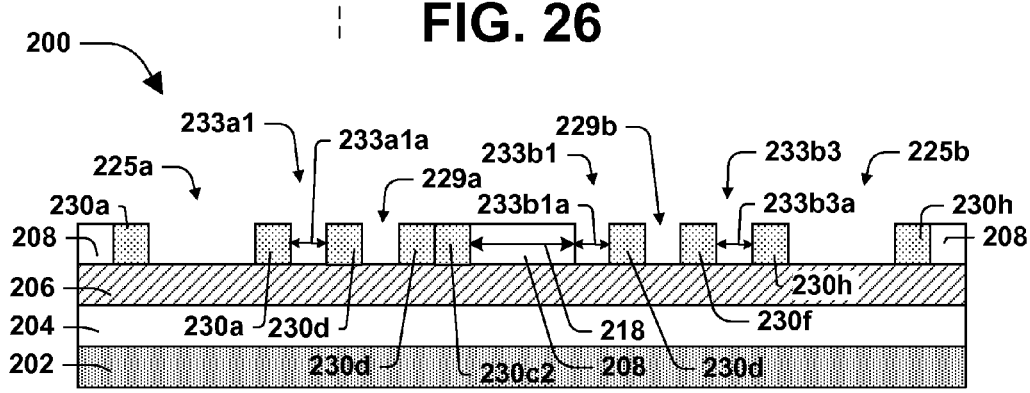
FIG. 27 is an illustration of a semiconductor arrangement, in accordance with some embodiments.

At 114 of method 100, as illustrated in FIGS. 26 and 27, where FIG. 26 illustrates a top down or overview of the semiconductor arrangement 200, and FIG. 27 illustrates a cross section of FIG. 26 along a line 27-27, the first spacer 224a is removed to form a first spacer opening 233a1 having a first spacer opening width 233a1a, to form a second spacer opening 233a3 having a second spacer opening width 233a3a and to form a third spacer opening 233a4 having a third spacer opening width 233a4a, such that the first spacer opening 223a1, the second spacer opening 223a3, the third spacer opening 233a4, the second opening 225a and the third opening 229a define a pattern 237, according to some embodiments. In some embodiments, at least one of the first spacer opening width 233a1a, the second spacer opening width 233a3a or the third spacer opening width 233a4a are substantially equal to the first line opening length 241. In some embodiments, the first spacer opening 233a1 is formed by removing the first portion of the first spacer 224a1. In some embodiments, the second spacer opening 233a3 is formed by removing the third portion of the first spacer 224a3. In some embodiments, the third spacer opening 233a4 is formed by removing the fourth portion of the first spacer 224a4. In some embodiments, a fourth spacer opening 233a2 is formed by removing the second portion of the first spacer 224a2. In some embodiments, a fifth spacer opening 233a5 is formed by removing the fifth portion of the first spacer 224a5. In some embodiments, a sixth spacer opening 233b1 is formed by removing the first portion of the second spacer 224b1. In some embodiments, a seventh spacer opening 233b2 is formed by removing the second portion of the second spacer 224b2. In some embodiments, an eighth spacer opening 233b3 is formed by removing the third portion of the second spacer 224b3. In some embodiments, a ninth spacer opening 233b4 is formed by removing the fourth portion of the second spacer 224b4. In some embodiments, at least one of the fourth spacer opening 233a2, the fifth spacer opening 233a5, the sixth spacer opening 233b1, the seventh spacer opening 233b2, the eighth spacer opening 233b3 or the ninth spacer opening 233b4 has a width that is substantially equal to the first line opening length 241. In some embodiments, the pattern 237 comprises at least one of the second opening 225a, the first spacer opening 233a1, the fourth spacer opening 233a2, the third opening 229a, the second spacer opening 233a3, the third spacer opening 233a4, the fifth spacer opening 233a5, the fifth opening 225c, the sixth opening 225d, the sixth spacer opening 233b1, the seventh spacer opening 233b2, the seventh opening 229b, the eighth spacer opening 233b3, the ninth spacer opening 233b4 or the fourth opening 225b.

Figure 28:
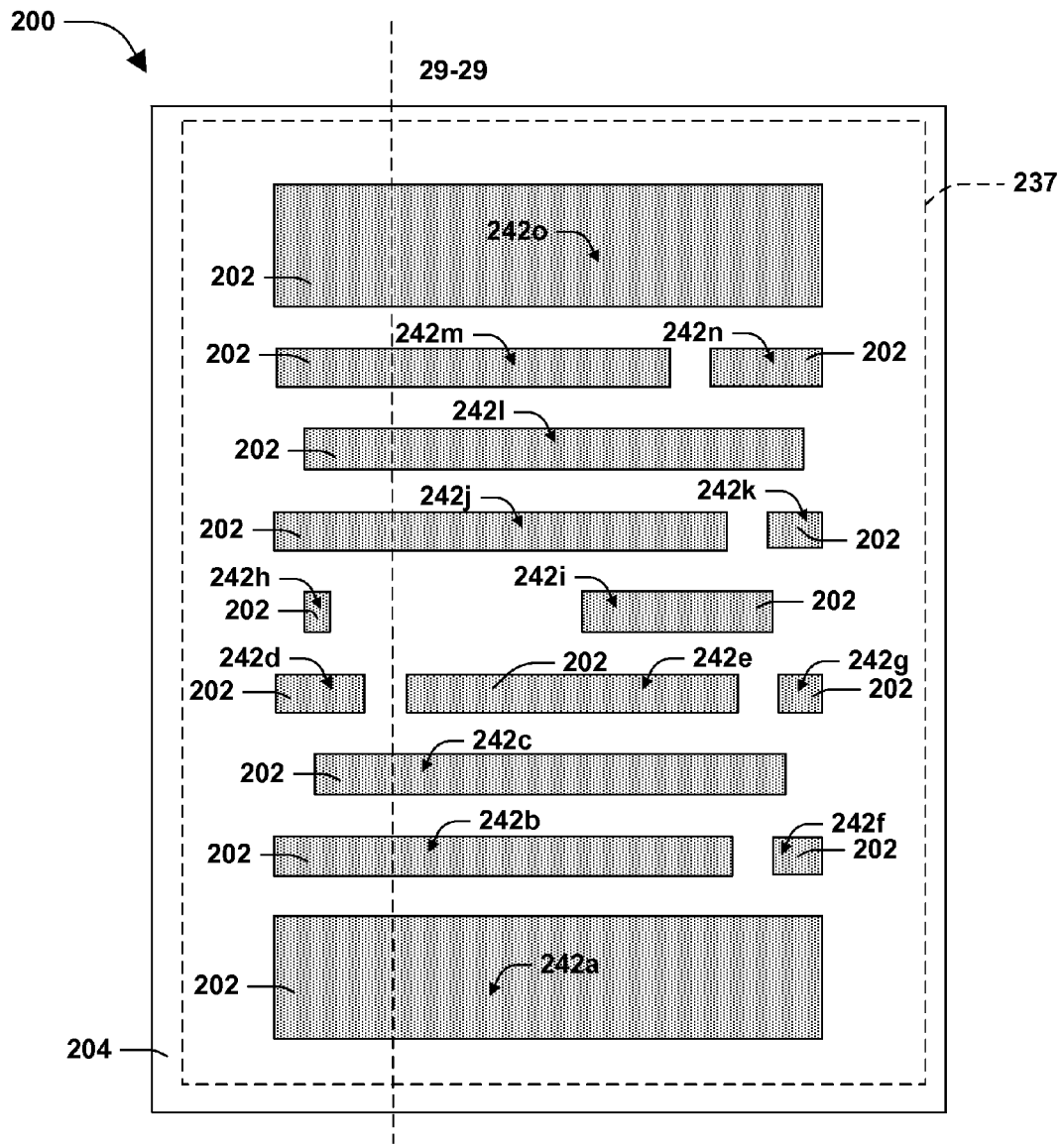
FIG. 28 is an illustration of a semiconductor arrangement, in accordance with some embodiments.
Figure 29:
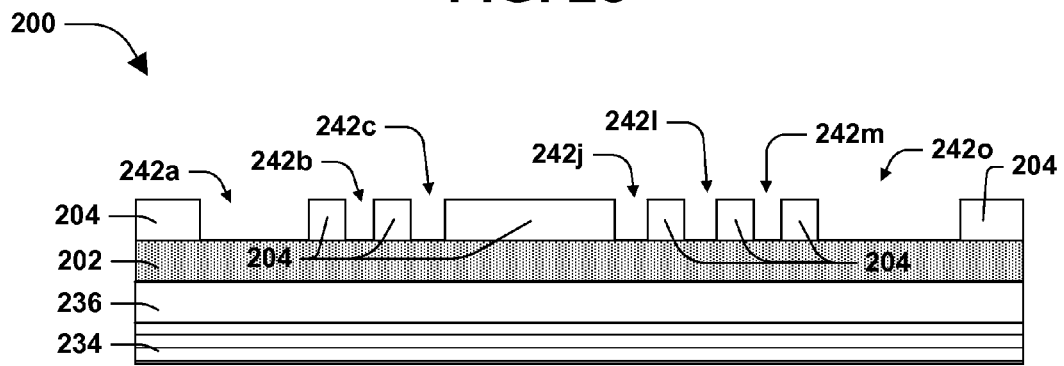
FIG. 29 is an illustration of a semiconductor arrangement, in accordance with some embodiments.
Figure 30:
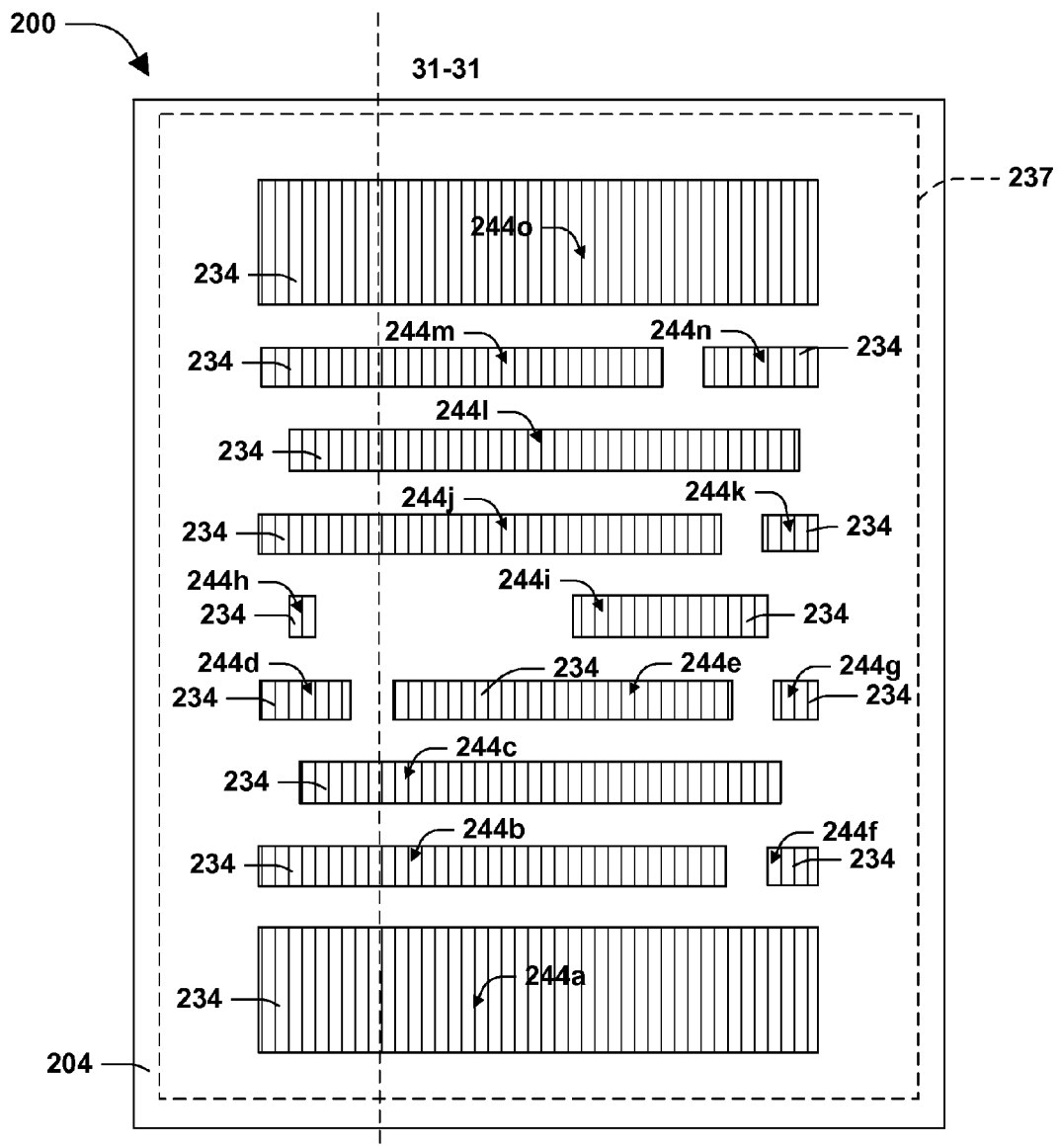
FIG. 30 is an illustration of a semiconductor arrangement, in accordance with some embodiments.
Figure 31:
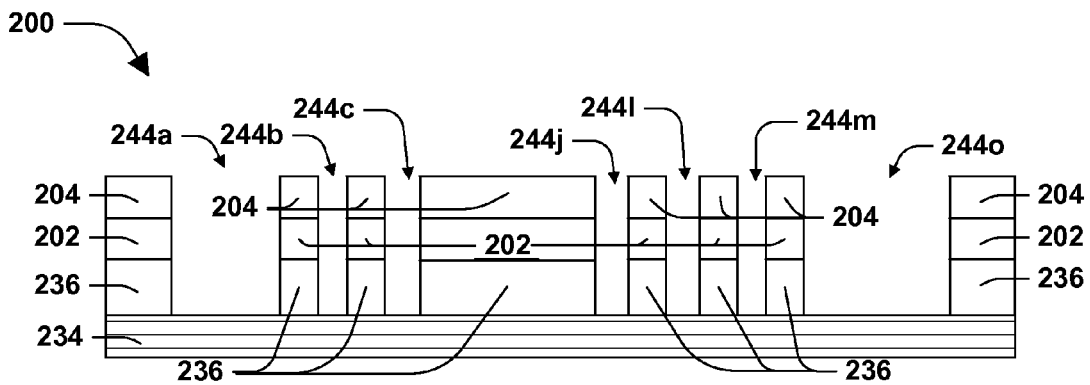
FIG. 31 is an illustration of a semiconductor arrangement, in accordance with some embodiments.

At 116 of method 100, as illustrated in FIGS. 30 and 31, where FIG. 30 illustrates a top down or overview of the semiconductor arrangement 200, and FIG. 31 illustrates a cross section of FIG. 30 along a line 31-31, the hard mask 206 is etched to transfer the pattern 237, such that a first dielectric opening 244a in the dielectric layer 236 corresponds to the second opening 225a, a second dielectric opening 244b corresponds to the first spacer opening 233a1, a third dielectric opening 244c corresponds to the third opening 229a, a fourth dielectric opening 244d corresponds to the second spacer opening 223a3 and a fifth dielectric opening 244e corresponds to the third spacer opening 233a4, according to some embodiments. Turning to FIGS. 28 and 29, prior to FIGS. 30 and 31, where FIG. 28 illustrates a top down or overview of the semiconductor arrangement 200, and FIG. 29 illustrates a cross section of FIG. 28 along a line 29-29, the hard mask 206 is etched to transfer the pattern 237, as an intermediate fabrication stage, such that a first metal opening 242a in the initial metal layer 204 corresponds to the second opening 225a, a second metal opening 242b corresponds to the first spacer opening 233a1, a third metal opening 242c corresponds to the third opening 229a, a fourth metal opening 242d corresponds to the second spacer opening 223a3 and a fifth metal opening 242e corresponds to the third spacer opening 233a4. In some embodiments, the hard mask 206 is etched to transfer the pattern 237, such that the pattern 237 comprises at least one of a sixth metal opening 242f in the initial metal layer 204 corresponding to the fourth spacer opening 233a2, a seventh metal opening 242g corresponding to the fifth spacer opening 233a5, an eighth metal opening 242h corresponding to the fifth opening 225c, a ninth metal opening 242i corresponding to the sixth opening 225d, a tenth metal opening 242*j* corresponding to the sixth spacer opening 233*b*1, an eleventh metal opening 242*k* corresponding to the seventh spacer opening 233*b*2, a twelfth metal opening 242*l* corresponding to the seventh opening 229*b*, a thirteenth metal opening 242*m* corresponding to the eighth spacer opening 233*b*3, a fourteenth metal opening 242*n* corresponding to the ninth spacer opening 233*b*4 or a fifteenth metal opening 242*o* corresponding to the fourth opening 225*b*. In some embodiments, at least one of the first metal opening 242*a*, the second metal opening 242*b*, the third metal opening 242*c*, the fourth metal opening 242*d*, the fifth metal opening 242*e*, a sixth metal opening 242*f*, the seventh metal opening 242*g*, the eighth metal opening 242*h*, the ninth metal opening 242*i*, the tenth metal opening 242*j*, the eleventh metal opening 242*k*, the twelfth metal opening 242*l*, the thirteenth metal opening 242*m*, the fourteenth metal opening 242*n* or the fifteenth metal opening 242*o* exposes the oxide layer 202. In some embodiments, the dielectric layer 236 is under the oxide layer 202. In some embodiments, the dielectric layer 236 comprises an extremely low dielectric constant material having a dielectric constant of less than about 3. In some embodiments, the dielectric layer 236 is over the IMD layer 234. The dielectric layer 236 and the IMD layer 236 are not illustrated in FIGS. 2-27 to simplify the figures. Turning to FIGS. 30 and 31, the oxide layer 202 is etched to transfer the pattern 237 such that the first dielectric opening 244*a* in the dielectric layer 236 corresponds to the first metal opening 242*a*, the second dielectric opening 244*b* corresponds to the second metal opening 242*b*, the third dielectric opening 244*c* corresponds to the third metal opening 242*c*, the fourth dielectric opening 244*d* corresponds to the fourth metal opening 242*d* and the fifth dielectric opening 244*e* corresponds to the fifth metal opening 242*e*. In some embodiments, the oxide layer 202 is etched to transfer the pattern 237 such that at least one of a sixth dielectric opening 244*f* in the dielectric layer 236 corresponds to the sixth metal opening 242*f*, a seventh dielectric opening 244*g* corresponds to the seventh metal opening 242*g*, an eighth dielectric opening 244*h* corresponds to the eighth metal opening 242*h*, a ninth dielectric opening 244*i* corresponds to the ninth metal opening 242*i*, a tenth dielectric opening 244*j* corresponds to the tenth metal opening 242*j*, an eleventh dielectric opening 244*k* corresponds to the eleventh metal opening 242*k*, a twelfth dielectric opening 244*l* corresponds to the twelfth metal opening 242*l*, a thirteenth dielectric opening 244*m* corresponds to thirteenth metal opening 242*m*, a fourteenth dielectric opening 244*n* corresponds to fourteenth metal opening 242*n* or a fifteenth dielectric opening 244*o* corresponds to fifteenth metal opening 242*o*.

At 118 of method 100, as illustrated in FIGS. 32 and 33, a metal layer 238 is formed in the first dielectric opening 244*a* to form the first metal trace 238*a*, in the second dielectric opening 244*b* to form the second metal trace 238*b*, in the third dielectric opening 244*c* to form the third metal trace 238*c*, in the fourth dielectric opening 244*d* to form the fourth metal trace 238*d*, and in the fifth dielectric opening 244*e* to form the fifth metal trace, according to some embodiments. In some embodiments, the metal layer 238 comprises copper. In some embodiments, the metal layer 238 is formed by ALD. In some embodiments, the first metal trace 238*a* has the first metal trace width 248*a* between about 30 nm to about 60 nm and the first metal trace length 246*a*. In some embodiments, the second metal trace 238*b* has the second metal trace width 248*b* between about 10 nm to about 20 nm and the second metal trace length 246*b*. In some embodiments, the first metal trace length 246*a* is different than the second metal trace length 246*b*. In some embodiments, the third metal trace 238*c* has the third metal trace width 248*c* between about 10 nm to about 20 nm and the third metal trace length 246*c*. In some embodiments, the third metal trace length 246*c* is at least one of greater then, equal to or less than the first metal trace length 246*a*. In some embodiments, the fourth metal trace 238*d* has the fourth metal trace width 248*d* between about 10 nm to about 20 nm and the fourth metal trace length 246*d*. In some embodiments, the fourth metal trace length 246*d* is at least one of greater then, equal to or less than the first metal trace length 246*a*. In some embodiments, the fifth metal trace 238*e* has the fifth metal trace width 248*e* between about 10 nm to about 20 nm and the fifth metal trace length 246*e*. In some embodiments, the fifth metal trace length 246*e* is at least one of greater then, equal to or less than the first metal trace length 246*a*. In some embodiments, the metal layer 238 is formed in the sixth dielectric opening 244*f* to form a sixth metal trace 238*f*. In some embodiments, the metal layer 238 is formed in the seventh dielectric opening 244*g* to form a seventh metal trace 238*g*. In some embodiments, the metal layer 238 is formed in the eighth dielectric opening 244*h* to form an eighth metal trace 238*h*. In some embodiments, the metal layer 238 is formed in the ninth dielectric opening 244*i* to form a ninth metal trace 238*i*. In some embodiments, the metal layer 238 is formed in the tenth dielectric opening 244*j* to form a tenth metal trace 238*j*. In some embodiments, the metal layer 238 is formed in the eleventh dielectric opening 244*k* to form an eleventh metal trace 238*k*. In some embodiments, the metal layer 238 is formed in the twelfth dielectric opening 244*l* to form a twelfth metal trace 238*l*. In some embodiments, the metal layer 238 is formed in the thirteenth dielectric opening 244*m* to form a thirteenth metal trace 238*m*. In some embodiments, the metal layer 238 is formed in the fourteenth dielectric opening 244*n* to form a fourteenth metal trace 238*n*. In some embodiments, the metal layer 238 is formed in the fifteenth dielectric opening 244*o* to form a fifteenth metal trace 238*o*. In some embodiments, at least one of the sixth metal trace 238*f*, the seventh metal trace 238*g*, the eighth metal trace 238*h*, the ninth metal trace 238*i*, the tenth metal trace 238*j*, the eleventh metal trace 238*k*, the twelfth metal trace 238*l*, the thirteenth metal trace 238*m* or the fourteenth metal trace 238*n* have a width that is substantially equal to first line opening length 241. In some embodiments, the fifteenth metal trace 238*o* has a width that is 3 times the first line opening length 241. In some embodiments, the oxide layer 202 and the initial metal layer 204 are removed, such as by chemical mechanical planarization (CMP). In some embodiments, the metal layer 238 is planerized, such as by CMP, such that a top surface of the metal layer 238 is even with a top surface of the dielectric layer 236. In some embodiments, the semiconductor arrangement 200 with metal trace widths less than 20 nm forms a smaller semiconductor arrangement than a semiconductor arrangement that has metal trace widths greater than 20 nm.

According to some embodiments, a method of forming a semiconductor arrangement comprises forming a first metal trace in a first dielectric opening in a dielectric layer, the first metal trace having a first metal trace width between about 30 nm to about 60 nm and a first metal trace length. According to some embodiments, the method of forming a semiconductor arrangement comprises forming a second metal trace in a second dielectric opening in the dielectric layer, the second metal trace having a second metal trace width between about 10 nm to about 20 nm and second metal trace length. In some embodiments, the first metal trace length is different than the second metal trace length, such that the dielectric layer has a dielectric layer width between the first metal trace and the second metal trace between about 10 nm to about 20 nm.

According to some embodiments, a semiconductor arrangement comprises a first metal trace having a first metal trace width between about 30 nm to about 60 nm and a first metal trace length. In some embodiments, a second metal trace has a second metal trace width between about 10 nm to about 20 nm and second metal trace length. In some embodiments, the first metal trace length is different than the second metal trace length. In some embodiments, a dielectric layer is between the first metal trace and the second metal trace, the dielectric layer has a dielectric layer width between the first metal trace and the second metal trace between about 10 nm to about 20 nm.

According to some embodiments, a method of forming a semiconductor arrangement comprises forming a first spacer on sidewalls defining a first opening in a first layer over a hard mask, where a first opening width of the first opening is about 5 times a first width of the first spacer, where the first width of the first spacer is between about 10 nm to about 20 nm and forming a first metal oxide layer in the first opening. According to some embodiments, the method of forming a semiconductor arrangement comprises forming a first line opening in the first spacer having a first line opening length that is about equal to the first width of the first spacer to expose the hard mask, the first line opening formed such that the first line opening is defined by the first layer, the first spacer and the metal oxide layer. According to some embodiments, the method of forming a semiconductor arrangement comprises forming a first end opening in the first spacer and a second end opening in the first spacer, such that the first spacer comprises two separate portions on opposing sidewalls of the first opening and forming a second opening in the first layer adjacent the first metal oxide layer and having a second opening width about 5 times the first line opening length. According to some embodiments, the method of forming a semiconductor arrangement comprises forming a third opening by removing at least some of the first metal oxide layer from the first opening, the third opening having a third opening width about 3 times the first line opening length and forming a second metal oxide layer on sidewalls defining the second opening, on sidewalls defining the third opening and in the first line opening. According to some embodiments, the method of forming a semiconductor arrangement comprises removing the first spacer to form a first spacer opening having a first spacer opening width about equal to the first line opening length, to form a second spacer opening having a second spacer opening width about equal to the first line opening length and to form a third spacer opening having a third spacer opening width about equal to the first line opening length, the second spacer opening diametrically opposing the third spacer opening relative to the second metal oxide layer in the line opening, the first spacer opening, the second spacer opening, the third spacer opening, the second opening and the third opening defining a pattern. According to some embodiments, the method of forming a semiconductor arrangement comprises etching the hard mask to transfer the pattern to a dielectric layer, such that a first dielectric opening in the dielectric layer corresponds to the second opening, a second dielectric opening corresponds to the first spacer opening, a third dielectric opening corresponds to the third opening, a fourth dielectric opening corresponds to the second spacer opening and a fifth dielectric opening corresponds to the third spacer opening. According to some embodiments, the method of forming a semiconductor arrangement comprises forming a metal layer in the first dielectric opening, in the second dielectric opening, in the third dielectric opening, in the fourth dielectric opening and in the fifth dielectric opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, the method comprising:
   forming a first metal trace in a first dielectric opening in a dielectric layer, the first metal trace having a first metal trace width between about 30 nm to about 60 nm and a first metal trace length; and
   forming a second metal trace in a second dielectric opening in the dielectric layer, the second metal trace having a second metal trace width between about 10 nm to about 20 nm and second metal trace length, the first metal trace length different than the second metal trace length, such that the dielectric layer has a dielectric layer width between the first metal trace and the second metal trace between about 10 nm to about 20 nm.

2. The method of claim 1, comprising:
   forming a third metal trace in a third dielectric opening in the dielectric layer, the third metal trace having a third metal trace width between about 10 nm to about 20 nm and a third metal trace length, the third metal trace length at least one of greater then, equal to or less than the first metal trace length, such that the dielectric layer has a second dielectric layer width between the second metal trace and the third metal trace between about 10 nm to about 20 nm.

3. The method of claim 1, at least one of:
   the forming the first metal trace comprising performing atomic layer deposition of copper, or
   the forming the second metal trace comprising performing atomic layer deposition of copper.

4. The method of claim 1, comprising at least one of:
   performing chemical mechanical planarization (CMP) on the first metal trace; or
   performing the CMP on the second metal trace.

5. A semiconductor arrangement comprising:
   a first metal trace having a first metal trace width between about 30 nm to about 60 nm and a first metal trace length;
   a second metal trace having a second metal trace width between about 10 nm to about 20 nm and a second metal trace length, the first metal trace length different than the second metal trace length; and
   a dielectric layer between the first metal trace and the second metal trace, the dielectric layer having a dielectric layer width between the first metal trace and the second metal trace between about 10 nm to about 20 nm.

6. The semiconductor arrangement of claim 5, at least one of:
   the first metal trace comprising copper; or
   the second metal trace comprising copper.

7. The semiconductor arrangement of claim 5, the dielectric layer comprising an extremely low dielectric constant material having a dielectric constant of less than about 3.

8. The semiconductor arrangement of claim 5, at least one of:
   a bottom surface of the first metal trace in contact with an inter metal dielectric (IMD) layer; or
   a bottom surface of the second metal trace in contact with the IMD layer.

9. The semiconductor arrangement of claim 5, comprising a third metal trace having a third metal trace width between about 10 nm to about 20 nm and a third metal trace length, such that the dielectric layer has a second dielectric layer width between the second metal trace and the third metal trace between about 10 nm to about 20 nm, the third metal trace length at least one of greater then, equal to or less than the first metal trace length.

10. A method of forming a semiconductor arrangement, the method comprising:
   forming a first spacer on sidewalls defining a first opening in a first layer over a hard mask, where a first opening width of the first opening is about 5 times a first width of the first spacer, where the first width of the first spacer is between about 10 nm to about 20 nm;
   forming a first metal oxide layer in the first opening;
   forming a first line opening in the first spacer having a first line opening length that is about equal to the first width of the first spacer to expose the hard mask, the first line opening formed such that the first line opening is defined by the first layer, the first spacer and the first metal oxide layer;
   forming a first end opening in the first spacer and a second end opening in the first spacer, such that the first spacer comprises two separate portions on opposing sidewalls of the first opening;
   forming a second opening in the first layer adjacent the first metal oxide layer and having a second opening width about 5 times the first line opening length;
   forming a third opening by removing at least some of the first metal oxide layer from the first opening, the third opening having a third opening width about 3 times the first line opening length;
   forming a second metal oxide layer on sidewalls defining the second opening, on sidewalls defining the third opening and in the first line opening;
   removing the first spacer to form a first spacer opening having a first spacer opening width about equal to the first line opening length, to form a second spacer opening having a second spacer opening width about equal to the first line opening length and to form a third spacer opening having a third spacer opening width about equal to the first line opening length, the second spacer opening diametrically opposing the third spacer opening relative to the second metal oxide layer in the first line opening, the first spacer opening, the second spacer opening, the third spacer opening, the second opening and the third opening defining a pattern;
   etching the hard mask to transfer the pattern to a dielectric layer, such that a first dielectric opening in the dielectric layer corresponds to the second opening, a second dielectric opening corresponds to the first spacer opening, a third dielectric opening corresponds to the third opening, a fourth dielectric opening corresponds to the second spacer opening and a fifth dielectric opening corresponds to the third spacer opening; and
   forming a metal layer in the first dielectric opening, in the second dielectric opening, in the third dielectric opening, in the fourth dielectric opening and in the fifth dielectric opening.

11. The method of claim 10, the etching comprising exposing an inter metal dielectric (IMD) layer under the dielectric layer.

12. The method of claim 10, comprising:
   forming a first photoresist composite;
   patterning the first photoresist composite using a first mask;
   etching the first layer using the first photoresist composite to form the first opening; and
   removing the first photoresist composite.

13. The method of claim 12, the forming the first line opening comprising:
   forming a second photoresist composite;
   patterning the second photoresist composite using a second mask;

etching the first spacer using the second photoresist composite to form the first line opening; and removing the second photoresist composite.

14. The method of claim 13, the forming the second opening comprising:
forming a third photoresist composite;
patterning the third photoresist composite using a third mask;
etching the first layer using the third photoresist composite to form the second opening; and
removing the third photoresist composite.

15. The method of claim 14, the forming the third opening comprising:
forming a fourth photoresist composite;
patterning the fourth photoresist composite using the first mask;
etching the first metal oxide layer using the fourth photoresist composite to form the third opening; and
removing the fourth photoresist composite.

16. The method of claim 15, at least one of:
the forming the first photoresist composite comprising forming a first middle layer over a first bottom layer and forming a first photoresist over the first middle layer;
the forming the second photoresist composite comprising forming a second middle layer over a second bottom layer and forming a second photoresist over the second middle layer;
the forming the third photoresist composite comprising forming a third middle layer over a third bottom layer and forming a third photoresist over the third middle layer; or
the forming the fourth photoresist composite comprising forming a fourth middle layer over a fourth bottom layer and forming a fourth photoresist over the fourth middle layer.

17. The method of claim 10, the forming the first spacer comprising performing atomic layer deposition of at least one of silicon or nitride.

18. The method of claim 10, at least one of:
the forming the first metal oxide layer comprising performing atomic layer deposition of at least one of titanium or oxide, or
the forming the second metal oxide layer comprising performing atomic layer deposition of at least one of titanium or oxide.

19. The method of claim 10, comprising performing chemical mechanical planarization (CMP) on the metal layer to form a first metal trace in the first dielectric opening, a second metal trace in the second dielectric opening, a third metal trace in the third dielectric opening, a fourth metal trace in the fourth dielectric opening, and a fifth metal trace in the fifth dielectric opening.

\* \* \* \* \*